US012706166B2

(12) United States Patent
Guan et al.

(10) Patent No.: US 12,706,166 B2
(45) Date of Patent: Aug. 11, 2026

(54) MEMORY DEVICES, PROGRAM METHODS, AND MEMORY SYSTEMS

(71) Applicant: Yangtze Memory Technologies Co., Ltd., Wuhan (CN)

(72) Inventors: Lei Guan, Wuhan (CN); HongTao Liu, Wuhan (CN); Ying Huang, Wuhan (CN); SongMin Jiang, Wuhan (CN); Yuanyuan Min, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 134 days.

(21) Appl. No.: 18/732,222

(22) Filed: Jun. 3, 2024

(65) Prior Publication Data

US 2025/0273281 A1 Aug. 28, 2025

(30) Foreign Application Priority Data

Feb. 28, 2024 (CN) ......................... 202410224587.8

(51) Int. Cl.
*G11C 16/34* (2006.01)
*G11C 16/04* (2006.01)

(52) U.S. Cl.
CPC ...... *G11C 16/3459* (2013.01); *G11C 16/0483* (2013.01)

(58) Field of Classification Search
CPC ........................ G11C 16/3459; G11C 16/0483
USPC .................................................... 365/185.22
See application file for complete search history.

(56) References Cited

U.S. PATENT DOCUMENTS

| | | | | |
|---|---|---|---|---|
| 11,410,739 | B1* | 8/2022 | Prakash | G11C 16/0483 |
| 2008/0055998 | A1* | 3/2008 | Jung | G11C 16/3454 365/185.18 |
| 2023/0402110 | A1* | 12/2023 | Zhang | G11C 16/24 |
| 2024/0319886 | A1* | 9/2024 | Zhang | G06F 3/0679 |

* cited by examiner

*Primary Examiner* — Amir Zarabian
*Assistant Examiner* — Anthony Thinh Tang
(74) *Attorney, Agent, or Firm* — Hanley, Flight & Zimmerman, LLC

(57) ABSTRACT

The present disclosure discloses a memory device, a program method, and a memory system. The memory device includes: a memory cell array and a peripheral circuit configured to: apply a verify voltage to a word line when incremental step pulse programming is performed on a plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; wherein the second program pulse is a previous program pulse of the first program pulse.

20 Claims, 17 Drawing Sheets

1101

Apply a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold

1102

Apply a first program pulse to the word line after the verification of the first data state is passed, so as to continue programming on the memory cells that are expected to be programmed to the second data state among the plurality of memory cells, wherein the first program pulse is a sum of a second program pulse and a preset offset voltage, and the second program pulse is a previous program pulse of the first program pulse

FIG. 11

MEMORY DEVICES, PROGRAM METHODS, AND MEMORY SYSTEMS

CROSS-REFERENCE TO RELATED APPLICATION

The present disclosure claims the benefit of priority to China Application No. 202410224587.8, filed on Feb. 28, 2024, the content of which is incorporated herein by reference in its entirety.

TECHNICAL FIELD

Examples of the present disclosure relate to the technical field of semiconductor technology, and in particular, to memory devices, program methods, and memory systems.

BACKGROUND

A memory device is a storage configured to save information in the modern information technology. As a typical non-volatile semiconductor memory, the Not-And (NAND) type memory gradually becomes a mainstream product in the memory market as it has a relatively-high memory density, controllable production costs, appropriate program and erase speeds, and a retention characteristic.

BRIEF DESCRIPTION OF THE DRAWINGS

In the drawings not necessarily drawn to scale, the like numerals may describe similar components in different views. Like numerals having different letter suffixes may represent different instances of similar components. The drawings illustrate generally, by way of example, but not by way of limitation, various examples discussed in the present document.

FIG. 11 is a schematic flowchart of a program method of a memory device provided by examples of the present disclosure;

DETAILED DESCRIPTION

Figure 1:
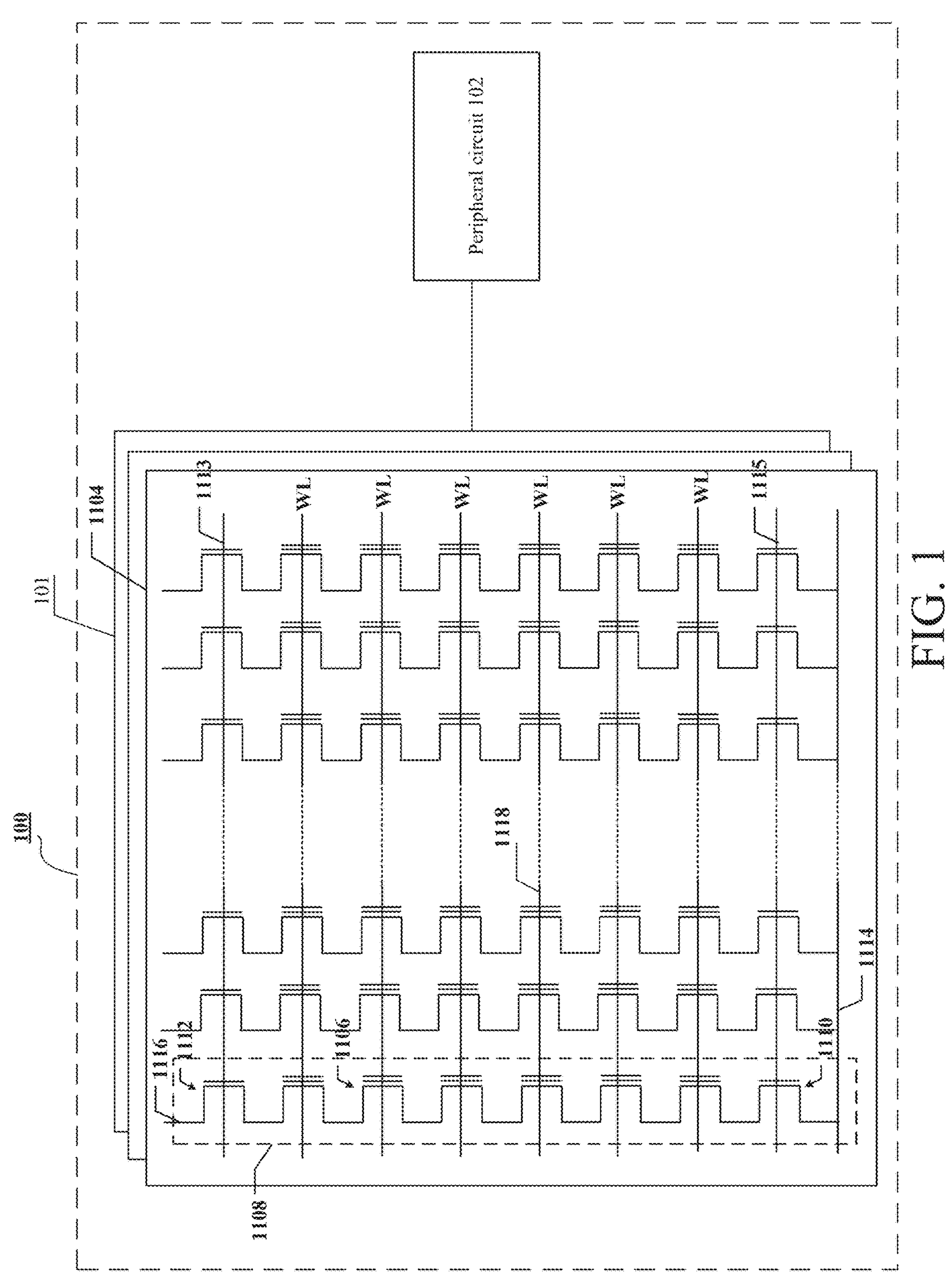
FIG. 1 is schematic structural diagrams of a memory device comprising a memory cell array and a peripheral circuit provided by examples of the present disclosure.

Examples of the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. Rather, these examples are provided so that the present disclosure can be more thoroughly understood and the scope of the present disclosure can be fully conveyed to those skilled in the art.

In the following description, numerous details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, sizes and relative sizes of layers, regions and elements may be exaggerated for clarity. Like reference numerals denote like elements throughout.

It will be understood that when an element or layer is referred to as being “on,” “adjacent to,” “connected to”, “coupled with” or “coupled to” other elements or layers, it can be directly on, adjacent to, connected to, or coupled to other elements or layers, or intervening elements or layers may be present. In contrast, when an element is referred to as being “directly on,” “directly adjacent to,” “directly connected to” or “directly coupled to” other elements or layers, there are no intervening elements or layers. It will be understood that, although the terms such as first, second, third etc. may be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present disclosure. When a second element, component, region, layer or section is discussed, it does not indicate that a first element, component, region, layer or section exists in the present disclosure.

Spatial relationship terms such as “under”, “below”, “beneath”, “underneath”, “on”, “above” and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as “below” or “underneath” or “under” other elements or features would then be oriented as “above” the other elements or features. Thus, the example terms “below” and “under” can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present disclosure. As used herein, “a”, “an” and “said/the” in singular forms are intended to include the plural forms as well, unless the context clearly dictates otherwise. It should also be understood that at least one of the terms “consists of” or “comprising”, when used in this specification, identify the presence of at least one of stated features, integers, operations, elements or components, but do not exclude presence or addition of at least one of one or more other features, integers, operations, elements, components or groups. As used herein, the term “at least one of . . . ” includes any and all combinations of the associated listed items.

In order to understand the features and technical contents of the examples of the present disclosure in more detail, the examples of the present disclosure are described in detail below with reference to the drawings, which are for reference only and are not intended to limit the examples of the present disclosure.

However, with the increasingly high requirements for the storage, there may still be much room for improvements in the memory device and a system thereof.

FIG. 1 shows a schematic structural diagram of a memory device 100 provided by examples of the present disclosure. As shown in FIG. 1, the memory device 100 may comprise: a memory cell array 101 comprising a plurality of memory cells and a word line coupled with the plurality of memory cells, wherein each memory cell is configured to be in one of a plurality of data states; and a peripheral circuit 102 coupled with the memory cell array 101 and configured to: apply a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; and apply a first program pulse to the word line after the verification of the first data state is passed, so as to continue programming on the memory cells that are expected to be programmed to the second data state, wherein the first program pulse is a sum of a second program pulse and a preset offset voltage, and the second program pulse is a previous program pulse of the first program pulse.

It is to be noted that, the memory device 100 described here may refer to a device for storing at least one of programs or data, and comprises the memory cell array 101 and the peripheral circuit 102. The memory cell array 101 may be a storage medium for storing at least one of the programs or data; and the peripheral circuit 102 is a general term of various circuits configured to control the memory cell array 101 and then store at least one of the programs or data in the memory cell array 101.

As shown in FIG. 1, as an example, the memory cell array 101 may be a NAND flash memory array. As shown in FIG. 1, memory cells 1106 of the memory cell array 101 are provided in the form of an array of NAND memory strings 1108, and each NAND memory string 1108 perpendicularly extends above a substrate (not shown). In some examples, each NAND memory string 1108 comprises the plurality of memory cells 1106 coupled in series and stacked perpendicularly. Each memory cell 1106 may keep a continuous analog value, such as a voltage or a charge, which depends on the number of electrons trapped within a storage area of the memory cell 1106. Each memory cell 1106 may be either a floating gate type memory cell that comprises a floating gate transistor, or a charge trapping type memory cell that comprises a charge trapping transistor.

In some examples, each memory cell 1106 may be a single level cell (SLC) that has two possible data states and thus may store one bit of data. For example, a first data state “0” may correspond to a first voltage range, and a second data state “1” may correspond to a second voltage range. In some examples, the first voltage range and the second voltage range may be referred to as threshold voltage distributions of the memory cells. In some examples, each memory cell 1106 may be a multi level cell (MLC). For example, the MLC may store two bits per cell (which may also be referred to as a double level cell (DLC)), for another example, store three bits per cell (which may also be referred to as a trinary level cell (TLC)), for yet another example, store four bits per cell (which may also be referred to as a quadruple level cell (QLC)). The plurality of data states of the memory cells, regardless of types, all comprise one erased state and (one or more) programmed states. When a program operation is performed on the memory cell, the memory cell in the erased state is programmed to one programmed state. Generally, a voltage value within the voltage range corresponding to the programmed state of the memory cell is relatively larger.

As shown in FIG. 1, each NAND memory string 1108 may comprise a source selective gate (SSG) 1110 at its source terminal and a drain selective gate (DSG) 1112 at its drain terminal. The SSG 1110 and the DSG 1112 may be configured to activate a selected NAND memory string 1108 (a column of the array) during read and program (or write) operations. In some examples, sources of the NAND memory strings 1108 in a same memory block 1104 are coupled through a same source line (SL) 1114 (for example, a common SL). In other words, according to some implementations, all the NAND memory strings 1108 in the same memory block 1104 have an array common source (ACS). According to some implementations, the DSG 1112 of each NAND memory string 1108 is coupled to a respective bit line 1116, and data may be read and written from the bit line 1116 via an output bus (not shown). In some examples, each NAND memory string 1108 is configured to be selected or deselected by at least one of applying a select voltage (e.g., above a threshold voltage of a transistor having the DSG 1112) or a deselect voltage (e.g., 0 V) to the respective DSG 1112 via one or more drain selective lines or top selective lines 1113 or by applying a select voltage (e.g., above a threshold voltage of a transistor having the SSG 1110) or a deselect voltage (e.g., 0 V) to the respective SSG 1110 via one or more source selective lines or bottom selective lines 1115.

Figure 4:
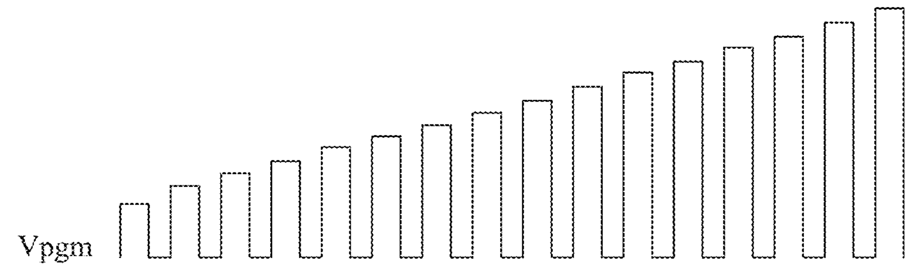
FIG. 4 is a schematic structural diagram of a step pulse of an ISPP mode provided by examples of the present disclosure.

As shown in FIG. 1, the NAND memory strings 1108 may be organized into a plurality of memory blocks 1104, and each of the plurality of memory blocks 1104 may have a common source line 1114 (e.g., coupled to the ground). In some examples, each memory block 1104 is a basic data unit for an erase operation, i.e., all of the memory cells 1106 on the same memory block 1104 are erased at the same time. In order to erase the memory cells 1106 in a selected memory block 1104, the source lines 1114 coupled to the selected memory block 1104 as well as unselected memory blocks 1104 that are in a same plane as the selected memory block 1104 may be biased with an erase voltage (Vers, such as a high positive voltage (e.g., 20 V or higher)). It is to be understood that, in some examples, the erase operation may be performed at a half memory block level, a quarter memory block level, or a level having any suitable number of memory blocks or any suitable fractions of a memory block. As shown in FIG. 4, the memory cells 1106 of the adjacent NAND memory strings 1108 may be coupled through word lines 1118, that is to say, the same word line 1118 may be coupled with the memory cells (i.e., corresponding memory cells) at a same position in the plurality of memory strings.

Figure 2:
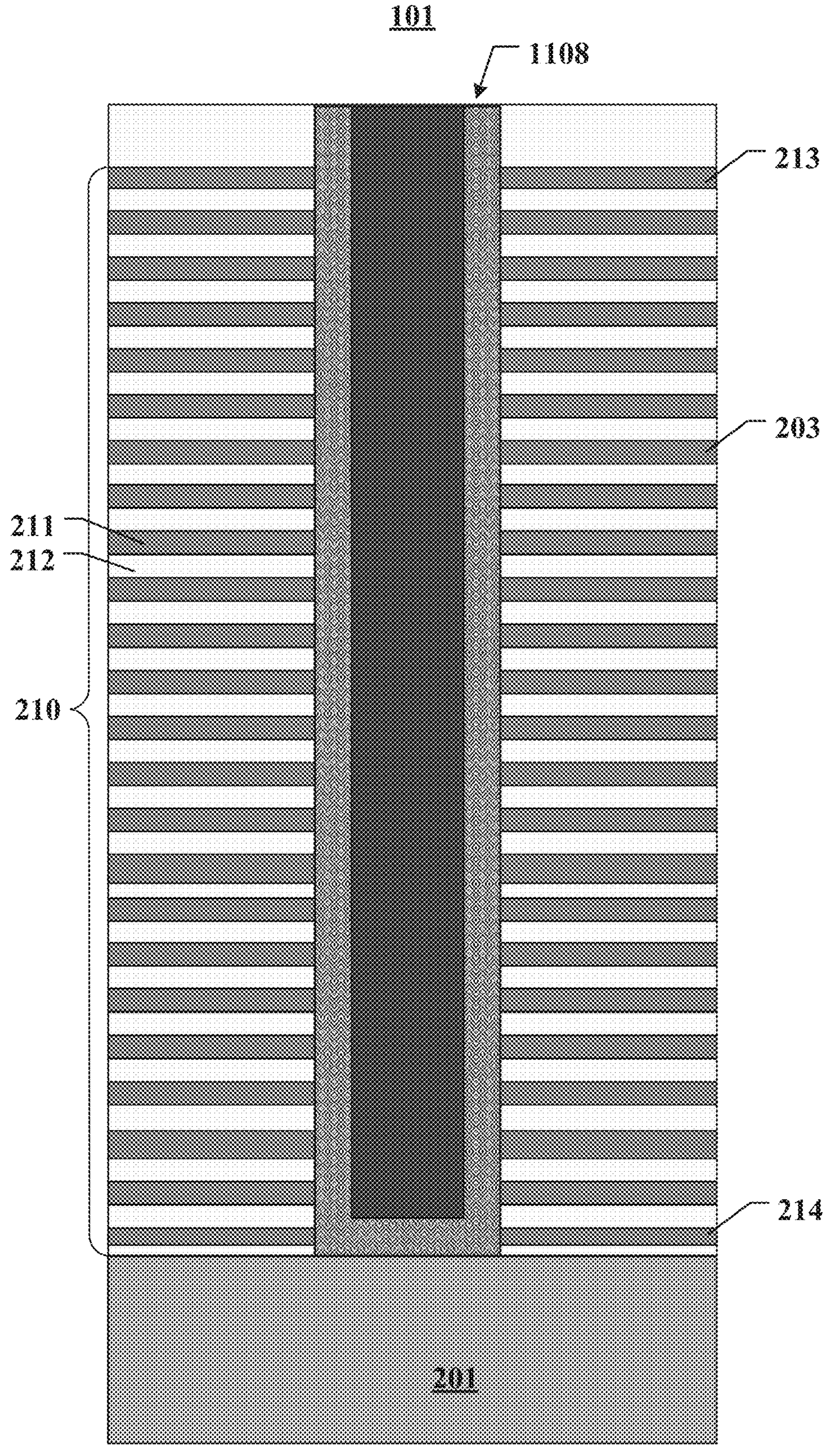
FIG. 2 is a schematic cross-sectional view of an example memory array comprising a NAND memory string provided by examples of the present disclosure.

FIG. 2 shows a cross-sectional view of an example memory cell array 101 comprising a NAND memory string 1108 according to some aspects of the present disclosure. As shown in FIG. 2, the NAND memory string 1108 may comprise a stack structure 210. The stack structure 210 comprises a plurality of gate layers 211 and a plurality of insulation layers 212, which are sequentially and alternately stacked, and a memory string 1108 vertically running through the gate layers 211 and the insulation layers 212. The gate layers 211 and the insulation layers 212 may be alternately stacked, and two adjacent gate layers 211 are spaced apart by one insulation layer 212. The number of pairs of the gate layers 211 and the insulation layers 212 in the stack structure 210 may determine the number of memory cells comprised in the memory cell array 101.

A constituent material of the gate layers 211 may comprise a conductive material. The conductive material includes, but is not limited to, tungsten (W), cobalt (Co), copper (Cu), aluminum (Al), polysilicon, doped silicon, silicides, or any combination thereof. In some implementations, each gate layer 211 comprises a metal layer, e.g., a tungsten layer. In some implementations, each gate layer 211 comprises a doped polysilicon layer. Each gate layer 211 may comprise a control gate around the memory cells. The gate layer 211 at the top of the stack structure 210 may laterally extend as a top selective gate line 213, i.e. a TSG line 1113, wherein the top selective gate line 213 is a lead-out line of the top selective gate (TSG) 1112 described above, so as to access a respective select voltage or deselect voltage. The gate layer 211 at the bottom of the stack structure 210 may laterally extend as a bottom selective gate line 214, i.e. a source selective line or a bottom selective line 1115, wherein the bottom selective gate line 214 is a lead-out line of the bottom selective gate (BSG) 1110 described above, so as to access a respective select voltage or deselect voltage. The gate layers 211 laterally extending between the top selective gate line and the bottom selective gate line may be used as word line layers 203, and these word line layers 203 are the word lines 1118 described above.

In some examples, the stacked structure 210 may be disposed on a substrate 201. The substrate 201 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, the NAND memory string 1108 includes a channel structure extending vertically through the stacked structure 210. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 3:
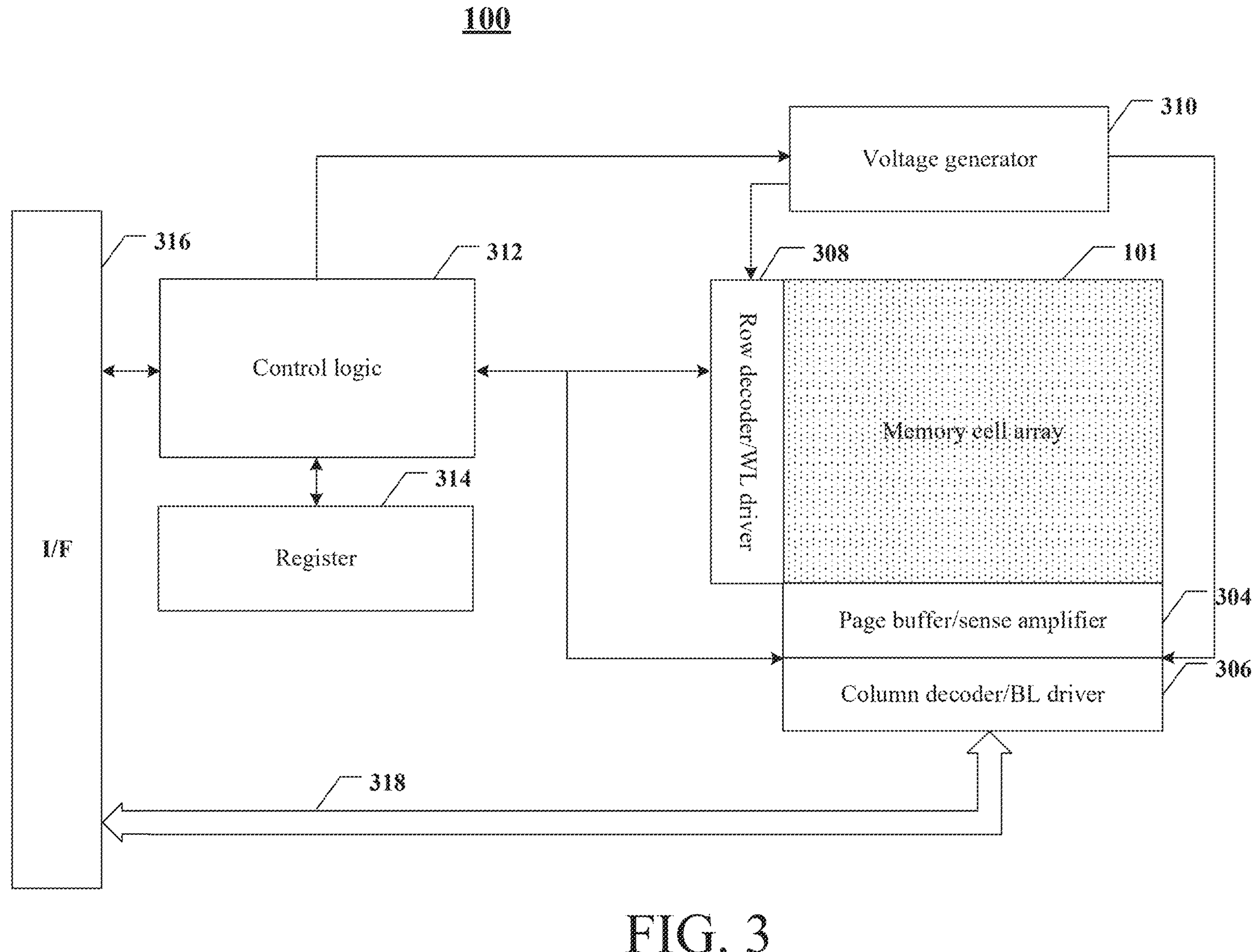
FIG. 3 is a schematic structural diagram of an example memory device comprising a peripheral circuit provided by examples of the present disclosure.

Referring back to FIG. 1, the peripheral circuit 102 can be coupled to the memory cell array 101 through bit lines 1116, word lines 1118, source lines 1114, SSG lines 1115, and DSG lines 1113. The peripheral circuit 102 can include any suitable analog, digital, and mixed-signal circuits for facilitating the operations of the memory cell array 101 by applying and sensing at least one of voltage signals or current signals to and from each target memory cell 1106 through bit lines 1116, word lines 1118, source lines 1114, SSG lines 1115, and DSG lines 1113. The peripheral circuit 102 can include various types of peripheral circuits formed using metal-oxide-semiconductor (MOS) technologies. For example, FIG. 3 illustrates some example peripheral circuits, the peripheral circuit 102 including a page buffer/sense amplifier 304, a column decoder/bit line driver 306, a row decoder/word line driver 308, a voltage generator 310, control logic 312, registers 314, an interface 316, and a data bus 318. It is understood that in some examples, additional peripheral circuits not shown in FIG. 3 may be included as well.

In an example, page buffer/sense amplifier 304 can be configured to read and program (write) data from and to the memory cell array 101 according to the control signals from the control logic 312. In one example, the page buffer/sense amplifier 304 may store program data (or referred to as write data) to be programmed into memory cells coupled with one word line in the memory cell array 101. In another example, the page buffer/sense amplifier 304 may perform program verify operations to ensure that the data has been properly programmed into memory cells 1106 coupled to selected word lines 1118. In still another example, the page buffer/sense amplifier 304 may also sense the low power signals from the bit line 1116 that represent data bits stored in the memory cells 1106 and amplify the small voltage swing to recognizable logic levels in a read operation. The column decoder/bit line driver 306 can be configured to be controlled by the control logic 312 and select one or more NAND memory strings 408 by applying bit line voltages generated from the voltage generator 310.

The row decoder/word line driver 308 can be configured to be controlled by the control logic 312 and select/deselect memory blocks 404 of the memory cell array 101 and select/deselect word lines 1118 of memory blocks 404. The row decoder/word line driver 308 can be further configured to drive word lines 1118 using word line voltages generated from the voltage generator 310. In some examples, the row decoder/word line driver 308 can also select/deselect and drive SSG lines 1115 and DSG lines 1113 as well. As described below in detail, the row decoder/word line driver 308 is configured to perform erase operations on the memory cells 1106 coupled to the selected word line(s) 1118. The voltage generator 310 can be configured to be controlled by the control logic 312 and generate the word line voltages (e.g., read voltage, program pulse, pass voltage, local voltage, verification voltage, etc.), bit line voltages, and source line voltages to be supplied to the memory cell array 101.

The control logic 312 may be coupled to each circuit described above and configured to control the operation of each peripheral circuit. Registers 314 can be coupled to the control logic 312 and include status registers, command registers, and address registers for storing status information, command operation codes (OP codes), and command addresses for controlling the operations of each peripheral circuit. The interface 316 may be coupled to the control logic 312 and act as a control buffer to buffer and relay control commands received from a host (not shown) to the control logic 312, and to buffer and relay status information received from the control logic 312 to the host. The interface 316 may further be coupled to the column decoder/bit line driver 306 via the data bus 318 and act as a data I/O interface and data buffer to buffer and relay data to or from the memory cell array 101.

Referring back to FIG. 1, the peripheral circuit 102 is coupled with the memory cell array 101 through the word line, and respective operations are achieved by applying respective operation voltages to the word line. The word line here is any one of the word lines 1118 described above. The plurality of memory cells described may be all or part of the memory cells coupled with the word line. The plurality of memory cells may further be referred to as one memory page (or referred to as a Page), which is a unit for programming or reading. Based on this, the operation provided by the examples of the present disclosure may comprise: when incremental step pulse programming (ISPP) is performed on the plurality of memory cells, after a certain program pulse, applying a verify voltage to the word line, simultaneously starting verifying a first data state and a second data state that are adjacent to each other and have a distance from threshold voltage distributions being greater than a preset threshold, and continuously applying a first program pulse to the word line after the verification of the first data state is passed, so as to continuously program the memory cells that are expected to be programmed to the second data state. The first program pulse may be a sum of a previous program pulse (i.e., a second program pulse) and a preset offset voltage. The preset offset voltage is greater than a step incremental voltage of ISPP. That is, when the distribution of threshold voltages (Vt) corresponding to the plurality of data states is uneven, and when programming to two data states with large intervals is expected, after the programming of the previous data state is passed, a larger program pulse may be employed when programming to the next data state, such that applied program pulse counts can be saved, thereby achieving the effect of improving program time.

Herein, the so-called ISPP may be to program the plurality of memory cells for several times while increasing a word line bias voltage step by step based on a step voltage, so as to cause the plurality of memory cells to be programmed to respective data states among the plurality of data states. The incremental step pulse Vpgm may be referred to FIG. 4. That is, the program pulse applied to the word line coupled with the programmed memory cells is gradually increased according to certain increments, until the programmed memory cells are programmed to a target data state. It is to be noted that, applying the program pulse once may be referred to as a program loop (PGM Loop).

Figure 5:
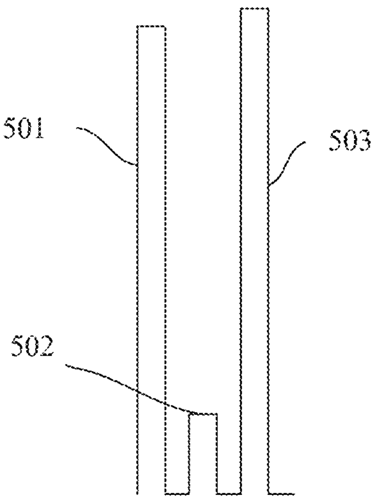
FIG. 5 is a schematic diagram of a verify voltage pulse provided by examples of the present disclosure.

It is to be understood that, during the programming of the memory cells, in order to understand whether the programmed memory cells are programmed to the target data state, a verify operation is added between the application of two program pulses to determine whether the programmed memory cells are programmed to the target data state. The two program pulses applied may be adjacent program pulses, or may also be program pulses that are not adjacent to each other. In other words, the program operation and the verify operation may be performed alternately, and the verify operation may also be performed after the plurality of program pulses are applied according to actual situations. The verify operation described may use one or a group of verify voltage pulses, and the verify voltage pulse is shown in FIG. 5. In FIGS. 5, 501 and 503 are step program pulses Vpgm, and 502 is the verify voltage pulse.

Based on this, the first verify operation and the second verify operation here respectively are for the verification of the first data state and the verification of the second data state, that is, the first verify operation is to verify whether respective memory cells are programmed to the first data state, and the second verify operation is to verify whether respective memory cells are programmed to the second data state. The verify voltage described is, for example, a verify voltage pulse shown in FIG. 5.

Figure 6A:
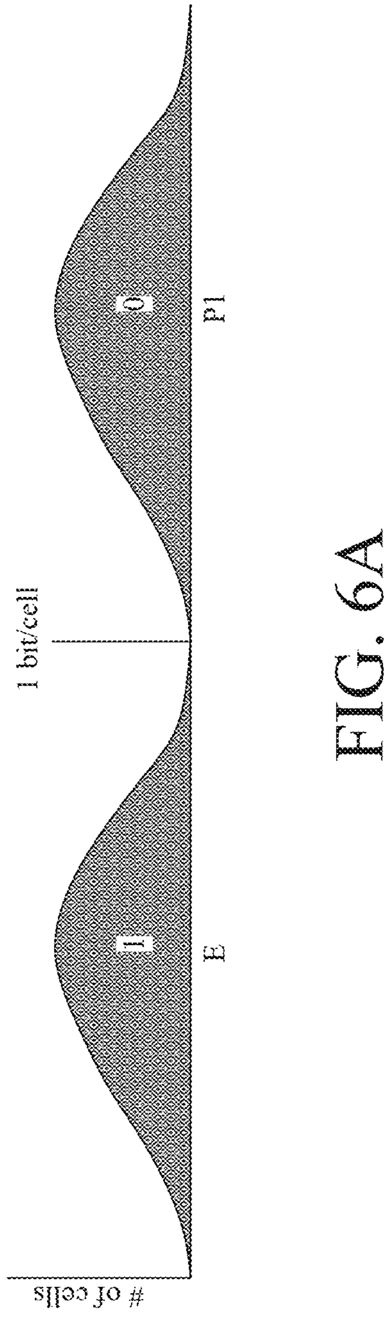
FIGS. 6A to 6D are schematic diagrams of threshold voltage distributions of different types of memory cells provided by examples of the present disclosure.
Figure 6B:
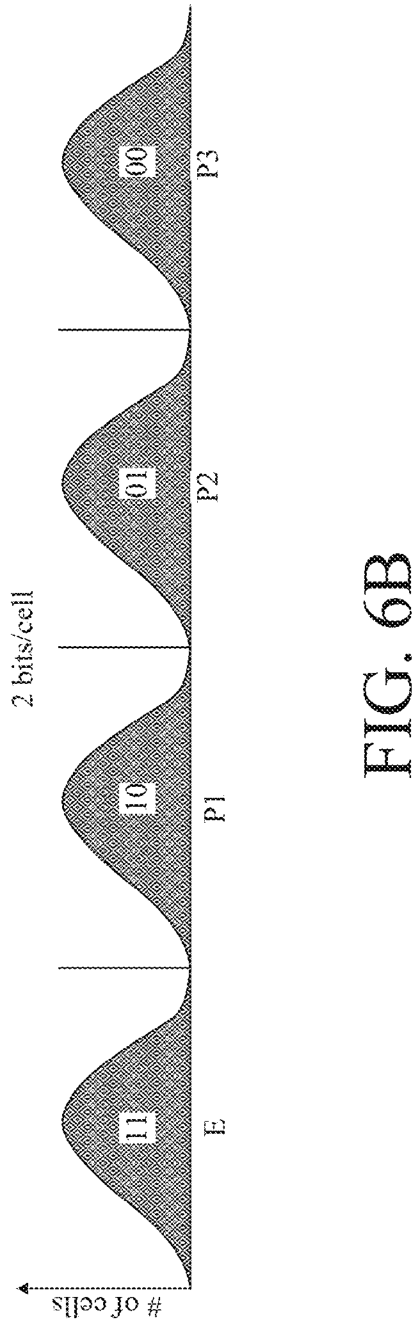
Figure 6C:
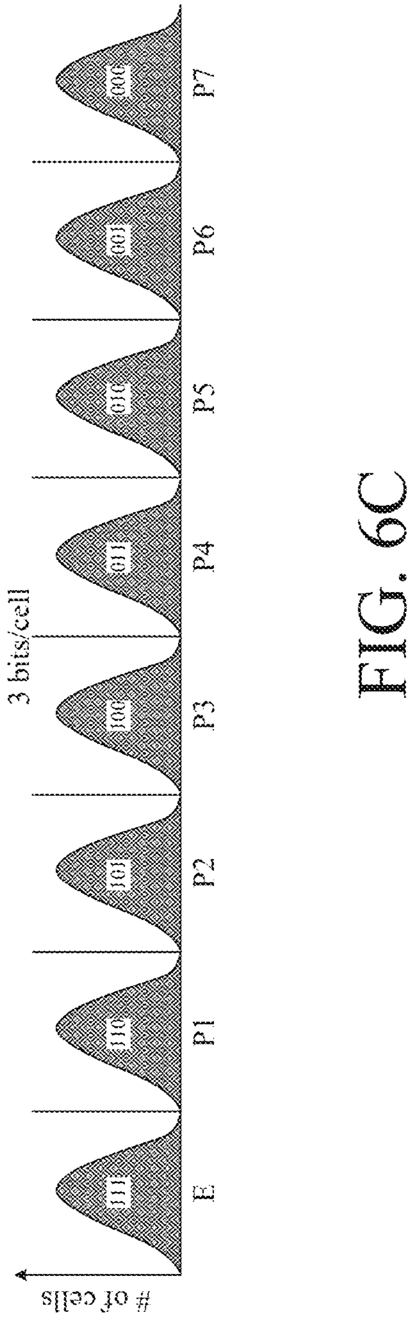
Figure 6D:
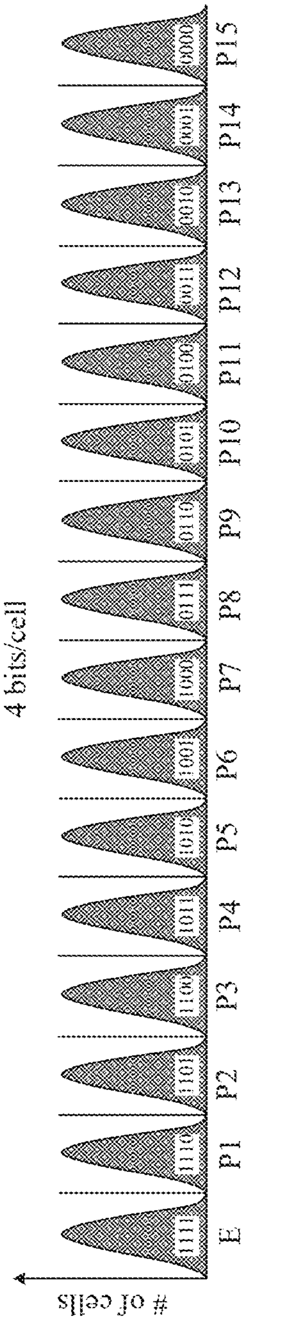

Actually, for one memory page, the memory cells comprised in the memory page are configured to store one-bit data, two-bit data, three-bit data, and the like described above. Then, according to the number of bits of data that the memory cells are configured to store, when one memory page is successfully programmed, the number of data states comprised in the memory page is different. In an example, the memory cell (also known as an SLC as described above) storing one-bit data corresponds to 2 data states, which are an erased state and a programmed state, and a threshold voltage distribution of the memory cell is shown in FIG. 6A. In an example, the memory cell (also known as a DLC as described above) storing two-bit data corresponds to 4 data states, which are an erased state and three programmed states, and a threshold voltage distribution of the memory cell is shown in FIG. 6B. In an example, the memory cell (also known as a TLC as described above) storing two-bit data corresponds to 8 data states, which are an erased state and seven programmed states, and a threshold voltage distribution of the memory cell is shown in FIG. 6C. In an example, the memory cell (also known as a QLC as described above) storing two-bit data corresponds to 16 data states, which are an erased state and fifteen programmed states, and a threshold voltage distribution of the memory cell is shown in FIG. 6D.

That is, as shown in FIG. 6A, SLC corresponds to two threshold voltage distributions: E and P1, wherein the threshold voltage distribution E corresponds to the erased data state, the threshold voltage distribution P1 corresponds to the data state, and a threshold voltage owned by the threshold voltage distribution E corresponding to the erased data state is less than a threshold voltage owned by the threshold voltage distribution P1 in the data state. Therefore, the memory cells having the threshold voltage in the threshold voltage distribution E are in the erased data state, and the memory cells having the threshold voltage in the threshold voltage distribution P1 is in the data state. In some examples, the memory cells in the erased data state store data 1, and the memory cells in the data state store data 0.

As shown in FIG. 6B, the DLC corresponds to four threshold voltage distributions, which are E, P1, P2, and P3, for which threshold voltages increase in sequence. Likewise, the threshold voltage distribution E corresponds to the erased data state, and the threshold voltage distributions P1, P2, and P3 correspond to the data states. In some examples, the erased memory cells store data 11; the memory cells programmed to a P1 data state store data 10; the memory cells programmed to a P2 data state store the data 10; and the memory cells programmed to a P3 data state store data 00.

As shown in FIG. 6C, the TLC corresponds to eight threshold voltage distributions, which are E, P1, P2, P3, P4, P5, P6, and P7, for which the threshold voltages increase in sequence. Likewise, the threshold voltage distribution E corresponds to the erased data state, and the threshold voltage distributions P1, P2, P3, P4, P5, P6, and P7 correspond to the data states. In some examples, the erased memory cells may store data 111; the memory cells programmed to a P1 data state store data 110; the memory cells programmed to a P2 data state store data 101; the memory cells programmed to a P3 data state store data 100; the memory cells programmed to a P4 data state store data 011; the memory cells programmed to a P5 data state store data 010; the memory cells programmed to a P6 data state store data 001; and the memory cells programmed to a P7 data state store data 000.

As shown in FIG. 6D, the QLC corresponds to 16 threshold voltage distributions, which are E, P1, P2, P3, P4, P5, P6, P7, P8, P9, P10, P11, P12, P13, P14, and P15, for which threshold voltages increase in sequence. Likewise, the threshold voltage distribution E corresponds to the erased data state; and the threshold voltage distributions P1, P2, P3, P4, P5, P6, P7, P8, P9, P10, P11, P12, P13, P14, and P15 correspond to the data states, and for a data state PN, the data state PN has a threshold voltage higher than that of a data state PN−1 and lower than that of a data state PN+1, wherein N is greater than or equal to 2. A voltage value in the threshold voltage distribution corresponding to the data state P1 is higher than a voltage value in the threshold voltage distribution corresponding to the data state E. In some examples, the erased memory cells may store data 1111; and the memory cells programmed to L1, L2, L3, L4, L5, L6, L7, L8, L9, L10, L11, L12, L13, L14, and L15 data states may store data 1110, 1101, 1100, 1011, 1010, 1001, 1000, 0111, 0110, 0101, 0100, 0011, 0010, 0001, and 0000 in sequence. It is to be noted that, regardless of the type of the memory cells described above, each threshold voltage distribution (data state) corresponds to predetermined values of a group of data bits stored in the memory cells, and a specific relationship between the data programmed in the memory cell and a level of the threshold voltage of the memory cell depends on a data encoding scheme employed by the memory cell, such as an encoding scheme using a Gray code.

According to the above-mentioned descriptions, the plurality of data states described here may refer to the corresponding data states when the memory cells in one memory page are arranged as types such as the DLC, the TLC, and the QLC, and the plurality of data states may refer to a plurality of intermediate data states during a program process or a plurality of target data states. In a practical application, for a flash memory device having the plurality of data states, such as a NAND flash memory device, in order to reduce coupling and interference between the word lines when the memory cells are programmed, in some examples, a plurality of programming passes may be employed when the memory page or block is programmed, so as to realize a closer threshold voltage distribution, such as a two-step programming scheme of the QLC, which may comprise 16-16, 10-16, 8-16, 6-16, 4-16, etc. In the present disclosure, the intermediate data states described may refer to results of successful programming of non-last programming passes among the plurality of programming passes. For example, in two-side programming of 4-16 described above, 4 data states that are configured to be comprised are the intermediate data states, wherein non-last programming passes may also be referred to as coarse programming. The target data states described may refer to the result of successful programming of the last programming pass among the plurality of programming passes. For example, in two-side programming of 4-16 described above, 16 data states that are configured to be comprised are the target data states, wherein the last programming pass is referred to as fine programming.

Herein, the so-called adjacent first data state and second data state may refer to two data states of which threshold voltage distributions are adjacent to each other when one memory page is programmed according to a program sequence from the data state of a low threshold voltage distribution to the data state of a high threshold voltage distribution. For example, the data state P1 and the data state P2 shown in FIG. 6B are the two adjacent data states. For another example, the data state P2 and the data state P3 shown in FIG. 6B are the two adjacent data states.

It is to be understood that, "first" in the first data state and "second" in the second data state are only for distinguishing two different data states, not for limitation. In other words, the first data state and the second data state here may refer to any two adjacent data states in FIGS. 6B, 6C, and 6D. The so-called first expected threshold voltage distribution may refer to a threshold voltage distribution corresponding to the first data state, such as the threshold voltage distribution corresponding to the data state P1, as shown in FIG. 6B. The so-called second expected threshold voltage distribution may refer to a threshold voltage distribution corresponding to the second data state, i.e., a range consisting of the threshold voltages to which corresponding memory cells are expected to be programmed, such as the threshold voltage distribution corresponding to the data state P2, as shown in FIG. 6B.

Figure 7:
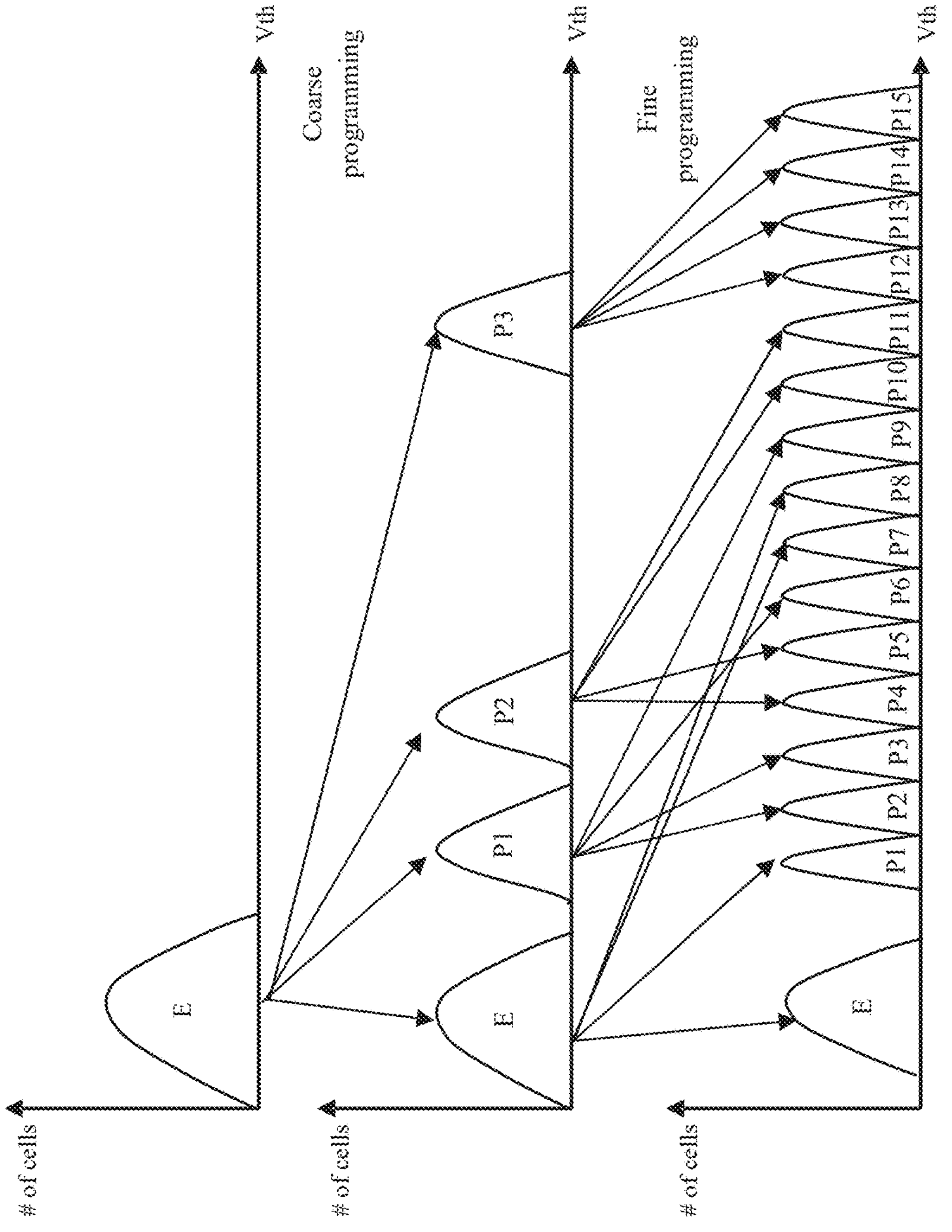
FIG. 7 is a schematic diagram of a threshold voltage distribution of coarse programming and a threshold voltage distribution of fine programming corresponding to an encoding scheme provided by examples of the present disclosure.
Figure 8:
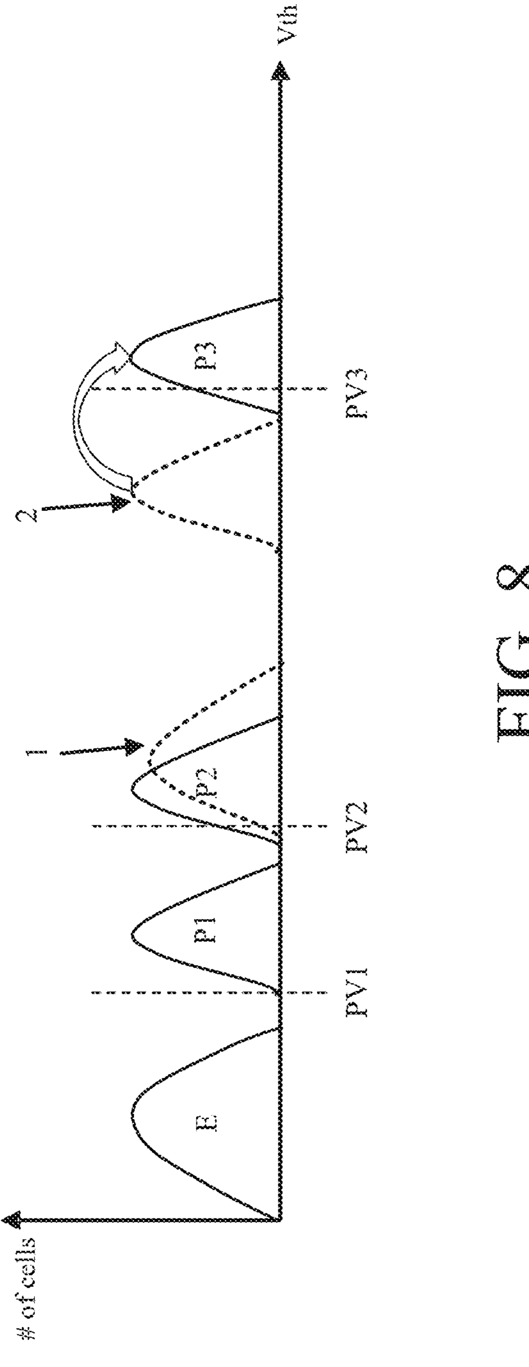
FIG. 8 is a schematic diagram of an effect of a programming scheme provided according to examples of the present disclosure provided by examples of the present disclosure.

The threshold voltage distributions in FIGS. 6B to 6D are threshold voltage distributions corresponding to the data states in a relatively-ideal state. Actually, in each programming scheme, for different Gray codes, the threshold voltage Vt of the memory cells during coarse programming and the threshold voltage Vt of the memory cells during fine programming have different correspondence relationship. During a process of the plurality of programming passes customized according to the set Gray code, the distance between the threshold voltage distributions corresponding to some adjacent intermediate data states during coarse programming is relatively large, as shown in FIG. 7, during the two-side programming of the memory cells of the QLC type, the distance between the threshold voltages corresponding to the data state P2 and the data state P3 of the memory cells during coarse programming is relatively large. In this case, if the respective memory cells are programmed according to the step incremental voltage of normal ISPP, more pulses need to be applied, resulting in long program time. Therefore, in examples of the present disclosure, during the program process, after the verification of the data state P2 is passed, one larger offset voltage is added on the basis of the previous program pulse, and a higher program pulse is employed to perform next programming to save the pulse count, thereby achieving the effect of improving program time. A detailed program effect is shown in FIG. 8. A dotted line 1 indicates the threshold voltage distribution corresponding to the second data state (such as the data state P3) after the verification of the first data state (such as the data state P2) is successful; and a dotted line 2 indicates the threshold voltage distribution of the data state P3 after a higher program pulse is employed to perform next programming. PV1, PV2, and PV3 respectively are verify voltages of the data state P1, the data state P2, and the data state P3. An arrow indicates next normal ISPP after a high program pulse is employed to perform next programming. Vth indicates the threshold voltage. From FIG. 8, it can be learned that, through a larger program pulse, the maximum of the threshold voltage distribution corresponding to the data state P3 is close to the verify voltage of the data state P3, then based on this, the program pulse of the normal ISPP is applied again (an incremental voltage is added), the memory cells are programmed to the data state P3, i.e., a program speed is accelerated. The incremental voltage here may be the same as or different from an incremental voltage before the higher program pulse is employed.

Herein, the distance between the first expected threshold voltage distribution corresponding to the first data state and the second expected threshold voltage distribution corresponding to the second data state may refer to a voltage difference between a maximum voltage value of the first expected threshold voltage distribution and a minimum voltage value of the second expected threshold voltage distribution, for example, a voltage difference between a maximum voltage value of the threshold voltage distribution corresponding to the data state P2 and a minimum voltage value of the threshold voltage distribution corresponding to the data state P3 of the memory cell during coarse programming shown in FIG. 7 is a distance between the threshold voltage distribution corresponding to the data state P2 and the threshold voltage distribution corresponding to the data state P3. That is, when the voltage difference is greater than the preset threshold, the first program pulse is the sum of the second program pulse and the preset offset voltage. Herein, the preset threshold described may be determined according to actual situations. In a solution, the preset threshold may be 1 volt (V). That is, when the voltage difference described above is greater than 1V, a preset offset voltage is required to obtain a larger program pulse.

In some examples, the preset offset voltage is positively correlated with the distance between the first expected threshold voltage distribution and the second expected threshold voltage distribution, wherein the greater the distance, the greater the preset bias offset voltage.

In some examples, the peripheral circuit may further be configured to: determine a verification result of the second verify operation after the verification of the first data state is passed; divide, according to the verification result, the memory cells that are expected to be programmed to the second data state among the plurality of memory cells into a plurality of groups; and apply different bit line voltages to bit lines coupled with different groups of memory cells among the plurality of groups of memory cells when the memory cells that are expected to be programmed to the second data state among the plurality of memory cells are continuously programmed.

It is to be noted that, during the program process, if the bit line voltage applied to the bit line connected to a memory string coupled with the memory cell is larger, the program speed of the memory cell is suppressed. Due to manufacturing or other reasons, the program speed of the memory cell is different. Therefore, the memory cells that are expected to be programmed to the second data state comprise, with no exception: the memory cells with a fast program speed, and may be rapidly programmed to the second data state; and the memory cells with a slow program speed, and may be programmed to the second data state with a slow speed. Therefore, when the memory cells corresponding to different program speeds are programmed, a higher bit line voltage is applied to the memory cells with the fast program speed to suppress the program speed, thereby preventing excessive programming. A smaller bit line voltage is applied to the memory cells with the slow program speed to guarantee the program speed. That is, after the verification of the first data state is successful, the memory cells that are expected to be programmed to the second data state are also programmed, and the threshold voltage distribution of the memory cells are, for example, shown in the dotted line 1 in FIG. 8. From FIG. 8, it can be learned that, after the verification of the first data state is successful, the difference between the threshold voltage corresponding to each memory cell that is expected to be programmed to the second data state and the second expected threshold voltage distribution corresponding to the second data state is different, such that for the memory cells with different threshold voltages, or the memory cells with different program speeds, in the subsequent program process, different bit line voltages need to be applied to the bit lines thereof. In an example, the memory cells that are expected to be programmed to the second data state are divided into a plurality of groups according to a verification result of the second verify operation, and different bit line voltages are applied to different groups of memory cells in a subsequent program loop.

In some examples, the peripheral circuit is further configured to: divide, according to the verification result, the memory cells that are expected to be programmed to the second data state among the plurality of memory cells into a first group and a second group, wherein the memory cells comprised in the first group are programmed to the second data state earlier than the memory cells comprised in the second group; and when the memory cells that are expected to be programmed to the second data state among the plurality of memory cells are continuously programmed, apply a first bit line voltage to the bit line coupled with the memory cells comprised in the first group, and apply a second bit line voltage to the bit line coupled with the memory cells comprised in the second group, wherein the first bit line voltage is greater than the second bit line voltage.

It is to be noted that, after the verification of the first data state is passed, since the second data state and the first data state are verified at the same time, in this case, the second verify operation performed on the second data state generates the verification result. The memory cells that are expected to be programmed to the second data state are divided into the first group and the second group according to the verification result of the second verify operation, and the memory cells comprised in the first group are programmed to the second data state earlier than the memory cells comprised in the second group. In this case, when programming continues again, a first bit line voltage is applied to the bit line coupled with the memory cells of the first group, and a second bit line voltage is applied to the bit line coupled with the memory cells of the second group, wherein the first bit line voltage is greater than the second bit line voltage.

Herein, the memory cells that are expected to be programmed to the second data state are divided according to the verification result of the second verify operation after the verification of the first data state is passed. One division mode may comprise the following: a threshold can be set; a difference value between the threshold voltage of the dotted line 1 and a minimum value of second expected threshold voltages is determined, and the difference value is compared with the threshold; the memory cells for which the difference value is less than the threshold are grouped to the first group; and the memory cells for which the difference value is greater than the threshold are grouped to the second group. There may also be other division modes. In a word, the program speeds of different groups of the memory cells are different, and during programming, different bit line voltages are applied thereto.

In some examples, the peripheral circuit is further configured to: after the application of the first program pulse and when the verification of the second data state is not passed, continuously apply a gradually increasing program pulse to the word line coupled with the plurality of memory cells step by step based on the first program pulse and by taking a step incremental voltage as a step size, until the verification of the last data state among the plurality of data states is passed, wherein the step incremental voltage is less than the preset offset voltage.

It is to be noted that, after the first program pulse, if the verification of the second data state is not passed, in this case, programming needs to be continued. During subsequent programming, the program pulse may be increased step by step based on the first program pulse using the step incremental voltage as a step size, until the verification of the last data state among the plurality of data states is passed. That is to say, after the first program pulse, if programming needs to be continued, the program pulse is increased step by step in an ISPP mode, so as to continue the program operation, until the verification of the last data state is passed.

In some examples, the last data state among the plurality of data states comprises the second data state. That is, the second data state may comprise the last among the plurality of data states, i.e., as long as the programming can make the verification of the second data state to be passed.

If the plurality of data states comprise the plurality of intermediate data states during coarse programming, in some examples, the peripheral circuit is further configured to: program each of the plurality of memory cells from one of the plurality of data states to a corresponding target data state among the plurality of target data states.

That is to say, the plurality of data states may be the intermediate data states, in this case, one intermediate data state needs to be further programmed to the corresponding target data state among the plurality of target data states.

In an example, as shown in FIG. 7, in some examples, the plurality of data states comprise a data state P0, a data state P1, a data state P2, and a data state P3 with sequentially increasing voltage values comprised in the expected threshold voltage distributions, wherein the first data state comprises the data state P2, and the second data state comprises the data state P3.

In some examples, the plurality of data states comprise 16 target data states, wherein each of the plurality of data states is configured to correspond to 4 target data states.

That is to say, the plurality of data states comprise the data state P0, the data state P1, the data state P2, and the data state P3 with sequentially increasing voltage values comprised in the expected threshold voltage distribution; and when there are 16 target data states, and programming is finally completed, each of the plurality of data states needs to be configured to correspond to 4 target data states. In an example, as shown in FIG. 7, the P0 of coarse programming corresponds to four target data states of E, P1, P7, and P8 in total; the P1 of coarse programming corresponds to four target data states of P2, P3, P6, and P9 in total; the P2 of coarse programming corresponds to four target data states of P4, P5, P10, and P11 in total; and the P3 of coarse programming corresponds to four target data states of P12, P13, P14, and P15 in total.

In some examples, the peripheral circuit may further be configured to: record the number of times for applying the program pulse to the word line coupled with the plurality of memory cells; and when the number of times for applying the program pulse is equal to a preset number of times, start to apply the verify voltage to the word line, so as to perform the verify operations on the first data state and the second data state among the plurality of data states simultaneously.

It is to be noted that, the preset number of times may be related to the step incremental voltage. The preset numbers of times are different for different step incremental voltages. If the step incremental voltage is higher, the preset number of times is fewer. That is to say, according to actual situations, after the preset number of times of program pulses are applied, the verify operation is performed on the first data state and the second data state at the same time.

Examples of the present disclosure provide a memory device. When the distribution of the threshold voltages Vt according to coarse programming or fine programming of an encoding scheme during programming, for example, the distance between the threshold voltage distributions of the data state P2 and the data state P3 is greater than the preset threshold, in this case, after a particular program pulse, program verification starts to be performed on the data state P2 and the data state P3 at the same time, after the verification of the data state P2 is passed, a larger program pulse is used to continue programming the memory cells that are expected to be programmed to the second data state, such that a program loop is reduced.

Figure 9:
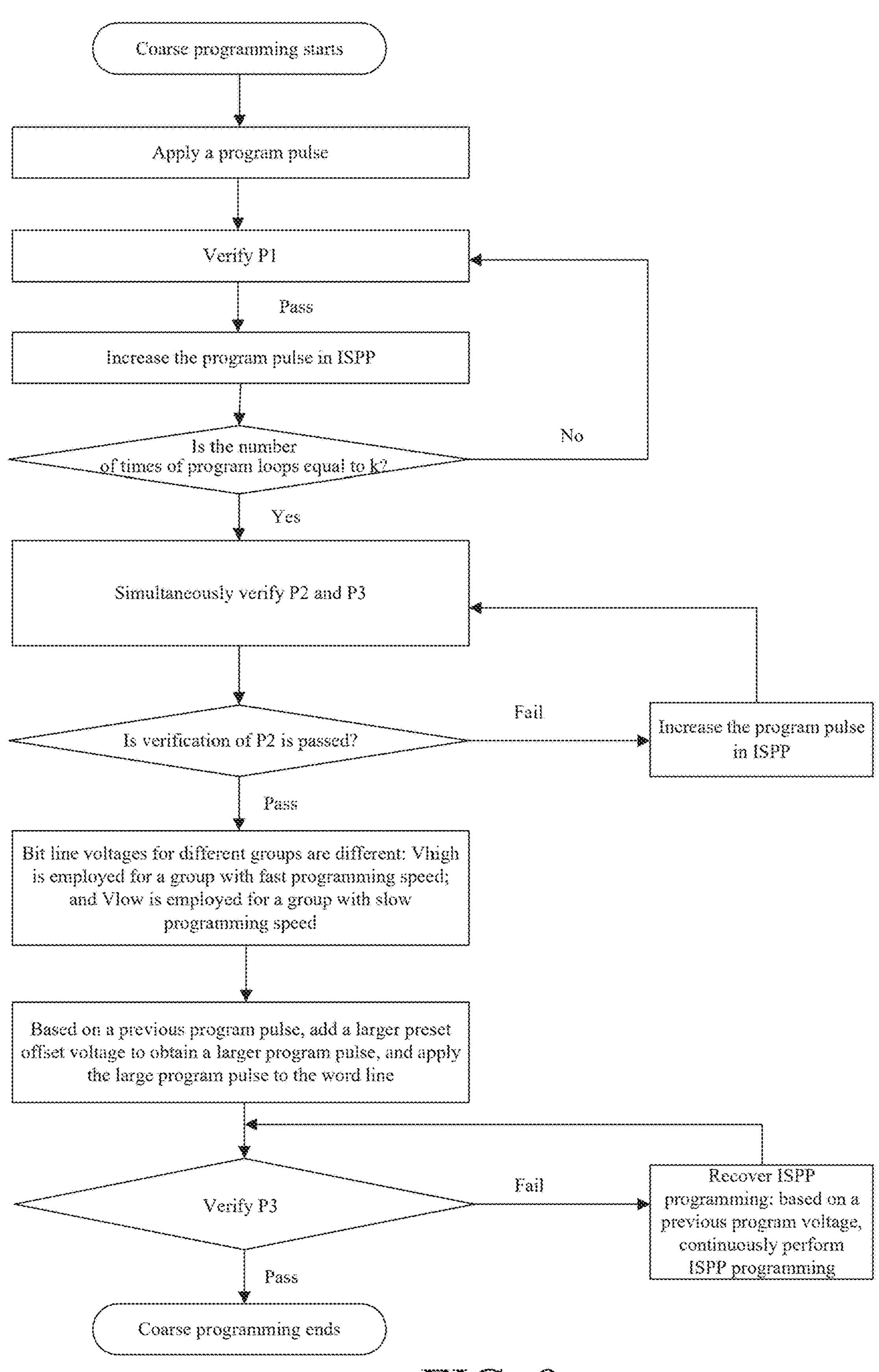
FIG. 9 is a flow diagram of coarse programming during 4-16 two-side programming of a QLC-type memory cell provided by examples of the present disclosure.
Figure 10:
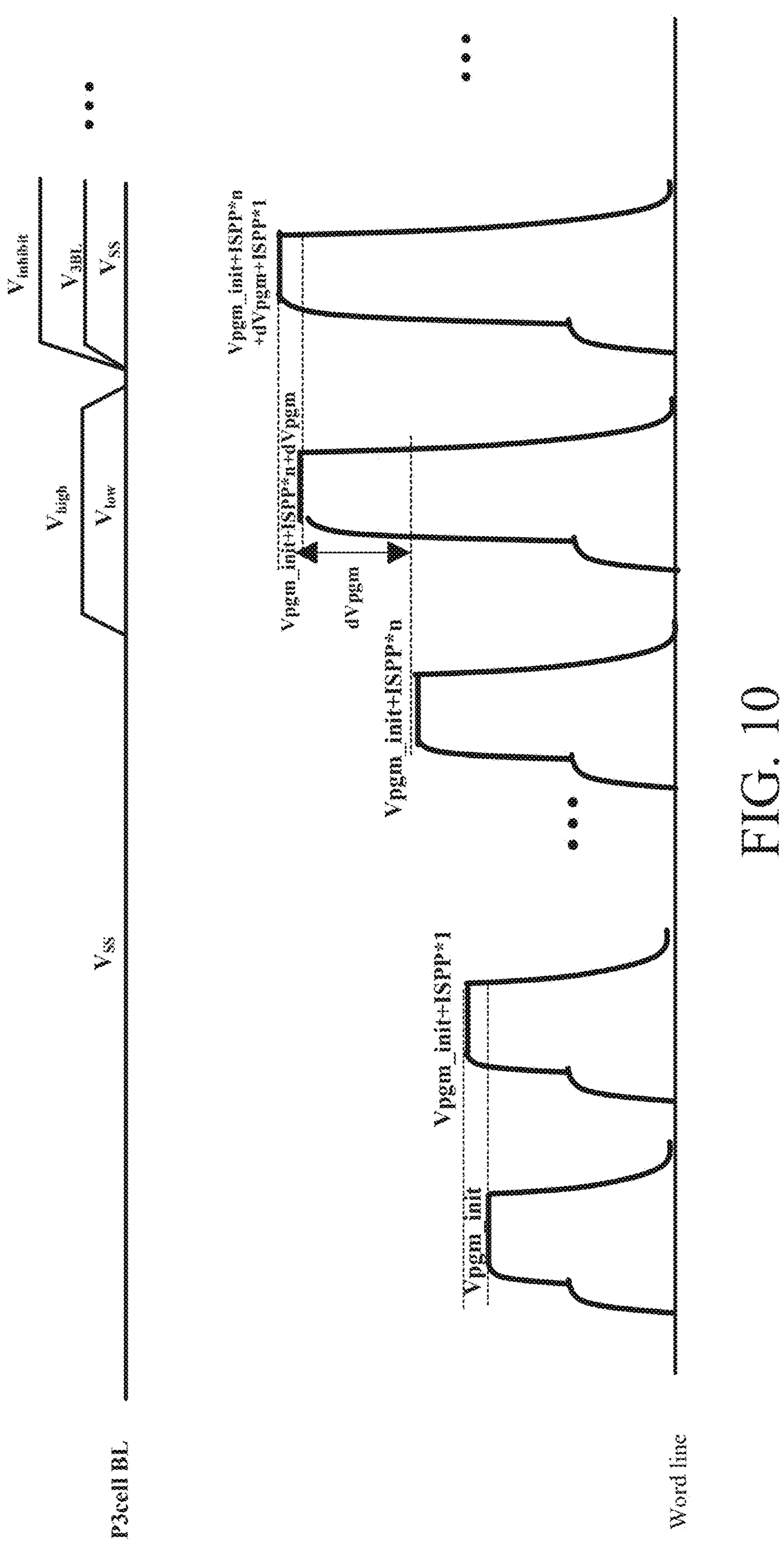
FIG. 10 is a schematic diagram of application waveforms of program pulses and bit line voltages for coarse programming shown in FIG. 9 provided by examples of the present disclosure.

In order to understand the present disclosure, description is performed with an example that the threshold voltage distribution during coarse programming in two-side programming in the 4-16 form of the QLC shown in FIG. 7 is uneven. Referring to FIG. 9 and FIG. 10, FIG. 9 describes a schematic flowchart of coarse programming, and FIG. 10 is a schematic diagram of application waveforms of program pulses and bit line voltages for coarse programming shown in FIG. 9.

Referring to FIG. 9, the flow of coarse programming may comprise: applying the program pulse to the respective word line to perform the program operation; verifying the data state P1; after the verification of the data state P1 is successful, increasing the program pulse according to the step incremental voltage with a set step size, and continue applying the program pulse to the word line to continue programming; simultaneously verifying the data state P2 and the data state P3 when the number of times of the applied program pulses reaches k (preset number of times); when the verification of the data state P2 is not successful, continue increasing the program pulse according to the step incremental voltage with the set step size, and continue applying the program pulse to the word line to continue programming; and when the verification of the data state P2 is successful, adding a higher preset offset voltage based on the previous program pulse, so as to obtain a larger program pulse (first program pulse), applying the larger program pulse to the word line, and at the same time, applying, according to a verification result of the data state P3 when the verification of the data state P2 is successful, different bit line voltages to the bit lines coupled with the memory cells in the first group with the fast program speed and the second group with the slow program speed into which the memory cells that are expected to be programmed to the data state P3 are divided, so as to perform the accurate program operation. $V_{high}$ is applied to the bit line of the memory cell of the first group, and $V_{low}$ is applied to the bit line of the memory cell of the second group, wherein the $V_{high}$ is greater than the $V_{low}$; and then, if the verification of the data state P3 is still not successful, gradually increasing program pulses are continuously applied to the word line coupled with the plurality of memory cells step by step based on the first program pulse and using the step incremental voltage as the step size, until the verification of the last of the plurality of data states is passed, and then coarse programming ends.

The flow of coarse programming shown in FIG. 9 may be summarized as follows: starting programming the P1/P2 data state (hereinafter referred to as P1 data state for P1 state, and P2 data state for P2 state) with ISPP, and starting verifying the P2/P3 data state (hereinafter referred to as P3 data state for P3 state) at the same time in the particular program loop (pgm loop), wherein the same verify voltage is used for the P3 state and the P2 state. According to the verification result, the memory cells that are expected to be programmed to the P3 state are grouped to a fast memory cell (fast cell) group with fast program speed, i.e., the first group, and a slow memory cell (slow cell) group with slow program speed, i.e., the second group. After the verification of the P2 state is passed, when programming continues according to verification information obtained through verification of the P3 state, for the fast cell, a high voltage ($V_{high}$) is applied to the corresponding bit line (BL); and for the slow cell, a slightly-low voltage ($V_{slow}$) is applied to the corresponding BL, wherein the $V_{slow}$ may be 0 V, or may also be a negative value, the $V_{high}$ is greater than the $V_{slow}$, such that the fast programming of the fast cell is suppressed, so as to prevent excessive programming. Furthermore, for the word line, an offset voltage (Vpgm offset, dVpgm, i.e., the preset offset voltage) is further added based on the program voltage of the previous pulse, and a next program pulse is continuously applied. In this case, P3 state+3sigma is close to the verify voltage of the P3 state. Then, if programming needs to be continued, ISPP programming is recovered: based on the previous program voltage, continue the ISPP programming, wherein the step incremental voltage (Pulse width) of ISPP may keep unchanged, and may also be increased or reduced properly. Programming is performed until the verification of the last state is passed.

Application waveforms of program pulses and bit line voltages for coarse programming shown in FIG. 9 are shown in FIG. 10. Referring to FIG. 10, programming starts, and Vpgm_init is applied to the word line, and then is increased in sequence according to an ISPP mode, for example, Vpgm_init+ISPP*n. Furthermore, when the verification of the data state P2 is successful, based on the program pulse, a preset offset voltage (dVpgm) is added, for example, Vpgm_init+ISPP*n+dVpgm. Then, programming is performed in an increasing order according to the ISPP mode, for example, Vpgm_init+ISPP*n+dVpgm+ISPP*1. Furthermore, when programming is performed by employing Vpgm_init+ISPP*n+dVpgm, the bit line voltages on the bit lines of the different groups of the memory cells among the memory cells that are expected to be programmed to P3 are different, for example, $V_{high}$ is employed for the memory cells with fast program speed, and $V_{low}$ is employed for the memory cells with slow program speed.

Figure 11:
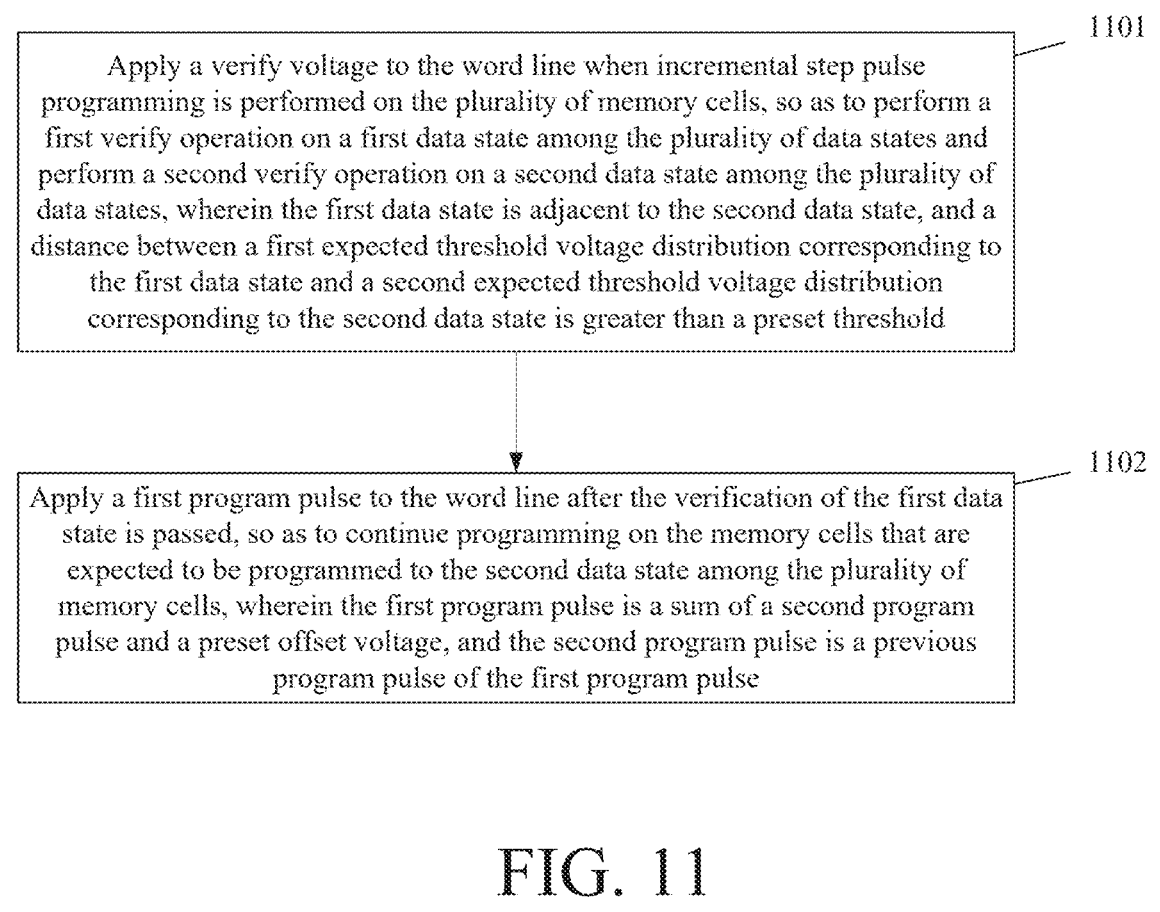

Based on the same concept as the above, as shown in FIG. 11, examples of the present disclosure further provide a method for programming a memory device. The memory device comprises a plurality of memory cells and a word line coupled with the plurality of memory cells, wherein each memory cell is configured to be in one of a plurality of data states. The program method may comprise:

1101: applying a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; and

1102: applying a first program pulse to the word line after the verification of the first data state is passed, so as to continue programming on the memory cells that are expected to be programmed to the second data state among the plurality of memory cells, wherein the first program pulse is a sum of a second program pulse and a preset offset voltage, and the second program pulse is a previous program pulse of the first program pulse.

In some examples, the program method may further comprise: determining a verification result of the second verify operation after the verification of the first data state is passed; dividing, according to the verification result, the memory cells that are expected to be programmed to the second data state among the plurality of memory cells into a plurality of groups; and applying different bit line voltages to bit lines coupled with different groups of memory cells among the plurality of groups of memory cells when the memory cells that are expected to be programmed to the second data state among the plurality of memory cells are continuously programmed.

In some examples, dividing, according to the verification result, the memory cells that are expected to be programmed to the second data state among the plurality of memory cells into a plurality of groups comprises: dividing, according to the verification result, the memory cells that are expected to be programmed to the second data state among the plurality of memory cells into a first group and a second group, wherein the memory cells comprised in the first group are programmed to the second data state earlier than the memory cells comprised in the second group; and applying different bit line voltages to bit lines coupled with different groups of memory cells among the plurality of groups of memory cells when the memory cells that are expected to be programmed to the second data state among the plurality of memory cells are continuously programmed comprises: when the memory cells that are expected to be programmed to the second data state among the plurality of memory cells are continuously programmed, applying a first bit line voltage to the bit line coupled with the memory cells comprised in the first group, and applying a second bit line voltage to the bit line coupled with the memory cells comprised in the second group, wherein the first bit line voltage is greater than the second bit line voltage.

In some examples, the program method further comprises: after the application of the first program pulse and when the verification of the second data state is not passed, continuously applying a gradually increasing program pulse to the word line coupled with the plurality of memory cells step by step based on the first program pulse and by taking a step incremental voltage as a step size, until the verification of the last data state among the plurality of data states is passed, wherein the step incremental voltage is less than the preset offset voltage.

In some examples, the last data state comprises the second data state.

In some examples, the program method further comprises: programming each of the plurality of memory cells from one of the plurality of data states to a corresponding target data state among the plurality of target data states.

In some examples, the plurality of data states comprise a data state P0, a data state P1, a data state P2, and a data state P3 with sequentially increasing voltage values comprised in the expected threshold voltage distributions, wherein the first data state comprises the data state P2, and the second data state comprises the data state P3.

In some examples, the plurality of data states comprise 16 target data states, wherein each of the plurality of data states is configured to correspond to 4 target data states.

In some examples, the program method further comprises: recording the number of times for applying the program pulse to the word line coupled with the plurality of memory cells; and when the number of times for applying the program pulse is equal to a preset number of times, starting to apply the verify voltage to the word line, so as to perform the verify operations on the first data state and the second data state among the plurality of data states simultaneously.

It is to be noted that, the method belongs to the same concept as the aforementioned memory device, and the nouns appearing in the method are explained in detail in the aforementioned memory device, and the same applies here without further elaboration.

Figure 12:
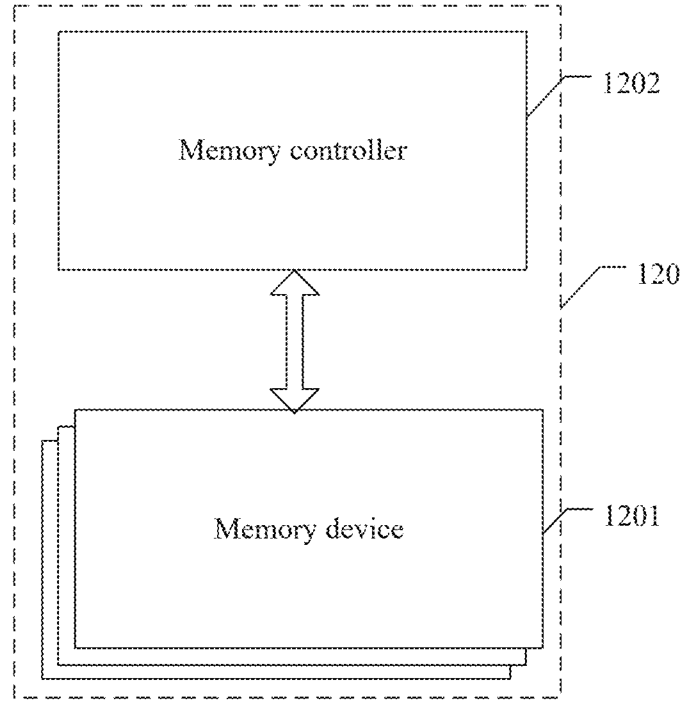
FIG. 12 is a schematic structural diagram of a memory system provided by examples of the present disclosure.

Based on the same concept as the above, as shown in FIG. 12, examples of the present disclosure further provide a memory system. The memory system 120 comprises: one or more memory devices 1201 described in any one of the above; and a memory controller 1202 coupled with the memory device and configured to control the memory device.

Figure 13A:
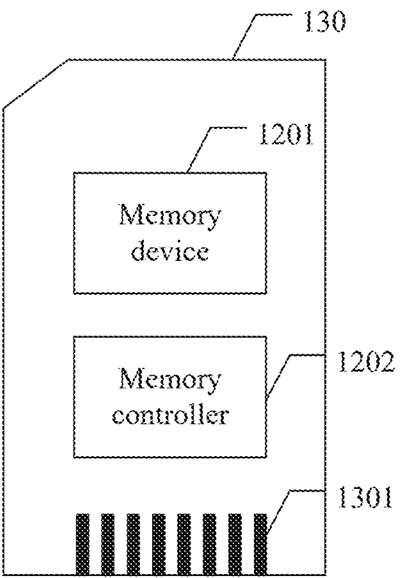
FIG. 13A is a schematic diagram of an example memory card having a memory system provided by examples of the present disclosure.
Figure 13B:
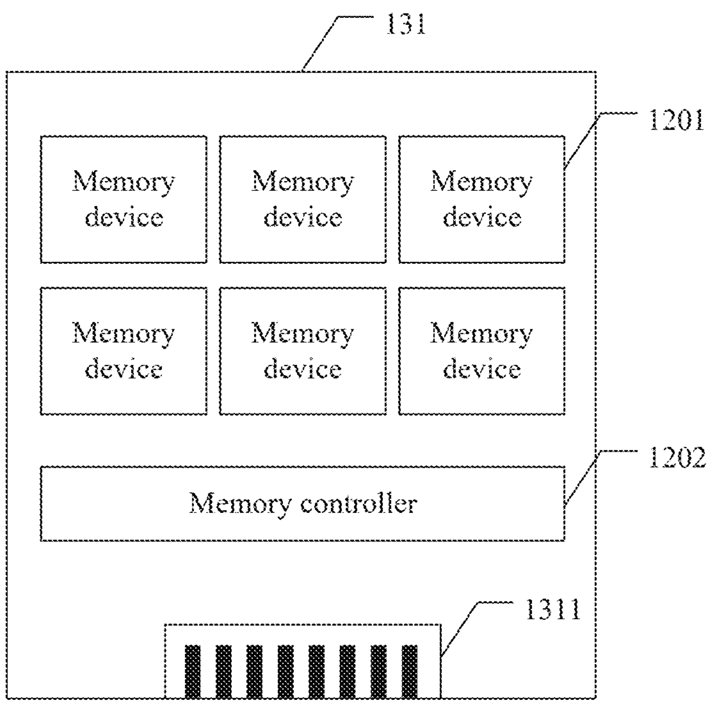
FIG. 13B is a schematic diagram of an example solid-state drive (SSD) having a memory system provided by examples of the present disclosure.

It is to be noted that, the memory system 120 may communicate with a host. At least one of the host or the memory system 120 may be comprised in various products, for example, Internet of Things (IoT) devices such as refrigerators or other devices, sensors, motors, mobile communication devices, automobiles, autonomous vehicles, and the like, so as to support processing, communication, or control of the products. In one example, the memory system 120 may be a discrete memory or memory component of a host device. In some other examples, the memory system 120 may also be part of an integrated circuit, e.g., part of a system on chip (SOC). In this case, the memory system 120 is assembled with one or more components of the host by stacking or in other manners. In some other examples, the aforementioned memory system may be implemented and packaged in a product such as a memory card, a driver, etc., as shown in FIG. 13A and FIG. 13B, wherein FIG. 13A shows a schematic diagram of an example memory card having a memory system provided by some aspects of the present disclosure, and FIG. 13B shows a schematic diagram of an example solid-state drive (SSD) having a memory system provided by some aspects of the present disclosure. In one example shown in FIG. 13A, the memory controller 1202 and the single memory device 1201 of the memory system may be integrated into a memory card 130. The memory card 130 may comprise a personal computer memory card international association (PCMCIA) Card (PC), a CF card, a smart media (SM) card, a memory stick, a multimedia card (MMC, RS-MMC, MMC micro), an SD card (SD, mini SD, micro SD, SDHC), a UFS, etc. The memory card 130 may further comprise a memory card connector 1301 coupling the memory card 130 with the host. In another example shown in FIG. 13B, the memory controller 1202 and the plurality of memory devices 1201 may be integrated into an SSD 131. The SSD 131 may further comprise an SSD connector 1311 coupling the SSD 131 with the host. In some examples, at least one of the storage capacity or operation speed of the SSD 131 is greater than that of the memory card 130.

In some examples, the host described above may comprise a processor and a host RAM, wherein the host RAM may comprise a DRAM, an SDRAM, or any other suitable volatile or non-volatile memory devices. The memory system 120 may be provided with one or more communication interfaces, to communicate with one or more components in the host. The one or more components in the host may be a serial advanced technology attachment (SATA) interface, a peripheral component interconnection-express (PCIe) interface, a universal serial bus (USB) interface, a universal flash storage (UFS) interface, an eMMC™ interface, and the like. The host may further comprise an electronic element, a memory card reader, or one or more other electronic elements outside the memory system 120.

In some examples, the memory controller 1202 may receive an instruction from the host, and communicates with the memory device 1201, for example, the memory controller 1202 transmits data to one or more memory cells, planes, sub-blocks, blocks, or pages in the memory device 1201 by performing a write or erase instruction, or the memory controller 1202 transmits the data to the host by performing a read instruction. For hardware, the memory controller 1202 may comprise one or more controller units, circuits, or components, and is configured to control access across the memory device 1201 and to provide a translation layer between the host and the memory system 120. The memory controller 1202 may further comprise one or more input/output (I/O) circuits, lines or interfaces to transfer data to or from the memory device 1201. The memory controller 1202 may further comprise a memory management unit and an array control unit. The memory management unit may comprise circuit hardware or firmware, such as a plurality of components or integrated circuits associated with various memory management functions. Operations or management functions of the memory system are described by using a NAND memory as an example. Those skilled in the art should be aware that other forms of non-volatile memory may have similar memory operations or management functions. Management functions of the NAND memory may comprise wear leveling, such as garbage collection or recycling, error detection or correction, block retiring, or one or more other memory management functions. The memory management unit may process an instruction of the host into a command that is recognizable by the memory system 120, for example, parse or format the instruction received from the host into a command related to the operation of the memory device 1201, and so on; or the memory management unit may also generate device commands for the array control unit or one or more other components of the memory system 120, for example, commands for realizing various memory management functions. The memory management unit may be configured to comprise a group of management tables. The group of management tables is used for maintaining various information associated with one or more components of the memory system 120, such as various information related to a memory cell array coupled with the memory controller 1202, or one or more memory cells. For example, the management table may comprise information such as the block age, block erase counts, error history, or one or more error counts and so on of one or more blocks of the memory cells coupled to the memory controller 1202. Error counts may comprise operation error counts, bit read error counts, etc. In some examples, a bit error is an uncorrectable bit error when the detected error count is higher than a certain threshold. In some examples, the management table maintains counts of correctable or non-correctable bit errors, etc. The management table may further comprise one or more L2P tables comprising one or more L2P pointers that are associated with a physical address corresponding to the memory device 1201 by using a logical address. In some examples, the management table may comprise at least one of an unencrypted L2P table or an encrypted L2P table. The unencrypted L2P table may comprise L2P pointers indicating an unencrypted logical address and an unencrypted physical address; and the encrypted L2P table may comprise encrypted L2P pointers of an encrypted physical address and an unencrypted logical address. During a practical application process, the management table may be shown at the memory management unit, i.e., the management table may be stored in the RAM of the memory controller 1202. In some other examples, the management table may also be stored in the memory device 1201. During use, the memory management unit may read part or all management table buffered from the RAM of the memory controller 1202, or may also read the management table from the memory device 1201.

The array control unit may comprise a circuit system or a component, which is configured to be controlled to complete the following related operations of the memory device, for example, the array control unit controls writing data to one or more memory cells of the memory system 120 coupled with the memory controller 1202, reading the data from the one or more memory cells, or erasing the one or more memory cells. The array control unit may receive a command sent by the host, or a host command generated inside the memory management unit; and the host command may be a command associated with wear leveling, error detection or correction, etc.

The array control unit may further comprise an error correction code (ECC) component, which may comprise an ECC engine or other circuit systems for detecting or correcting the following related errors, wherein the related errors may be errors existing during a process of writing or reading data to or from the one or more memory cells of the memory system 120 coupled with the memory controller 1202. The memory controller 1202 is configured to efficiently detect error events associated with various operations or data storage, such as, bit errors, operation errors, and the like, and to recover from the error events while maintaining the integrity of data transmission between the host and the memory system 120, or maintaining the integrity of the stored data, for example, the memory controller may use a redundant RAID memory, and the like, and may remove, e.g., retire faulty memory resources, for example, memory cells, memory arrays, pages, blocks, etc., for preventing future errors.

In the aforementioned memory system, in some examples, the memory device comprises: a memory cell array comprising a plurality of memory cells and a word line coupled with the plurality of memory cells, wherein each of the memory cells is configured to be in one of a plurality of data states; and a peripheral circuit coupled with the memory cell array and configured to: apply a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; and apply a first program pulse to the word line after the verification of the first data state is passed, so as to continue programming on the memory cells that are expected to be programmed to the second data state, wherein the first program pulse is a sum of a second program pulse and a preset offset voltage, and the second program pulse is a previous program pulse of the first program pulse.

In some examples, the peripheral circuit is further configured to: determine a verification result of the second verify operation after the verification of the first data state is passed; divide, according to the verification result, the memory cells that are expected to be programmed to the second data state among the plurality of memory cells into a plurality of groups; and apply different bit line voltages to bit lines coupled with different groups of memory cells among the plurality of groups of memory cells when the memory cells that are expected to be programmed to the second data state among the plurality of memory cells are continuously programmed.

In some examples, the peripheral circuit is further configured to: divide, according to the verification result, the memory cells that are expected to be programmed to the second data state among the plurality of memory cells into a first group and a second group, wherein the memory cells comprised in the first group are programmed to the second data state earlier than the memory cells comprised in the second group; and when the memory cells that are expected to be programmed to the second data state among the plurality of memory cells are continuously programmed, apply a first bit line voltage to the bit line coupled with the memory cells comprised in the first group, and apply a second bit line voltage to the bit line coupled with the memory cells comprised in the second group, wherein the first bit line voltage is greater than the second bit line voltage.

In some examples, the peripheral circuit is further configured to: after the application of the first program pulse and when the verification of the second data state is not passed, continuously apply a gradually increasing program pulse to the word line coupled with the plurality of memory cells step by step based on the first program pulse and by taking a step incremental voltage as a step size, until the verification of the last data state among the plurality of data states is passed, wherein the step incremental voltage is less than the preset offset voltage.

In some examples, the last data state among the plurality of data states comprises the second data state.

In some examples, the peripheral circuit is further configured to: program each of the plurality of memory cells from one of the plurality of data states to a corresponding target data state among the plurality of target data states.

In some examples, the plurality of data states comprise a data state P0, a data state P1, a data state P2, and a data state P3 with sequentially increasing voltage values comprised in the expected threshold voltage distributions, wherein the first data state comprises the data state P2, and the second data state comprises the data state P3.

In some examples, the plurality of data states comprise 16 target data states, wherein each of the plurality of data states is configured to correspond to 4 target data states.

In some examples, the peripheral circuit is further configured to: record the number of times for applying the program pulse to the word line coupled with the plurality of memory cells; and when the number of times for applying the program pulse is equal to a preset number of times, start to apply the verify voltage to the word line, so as to perform the verify operations on the first data state and the second data state among the plurality of data states simultaneously.

In the above-mentioned solution, the preset offset voltage is positively correlated with the distance between the first expected threshold voltage distribution and the second expected threshold voltage distribution, wherein the greater the distance, the greater the preset bias offset voltage.

It is to be noted that, the memory system comprises the aforementioned memory device, such that the memory system and the memory device have the same technical features, and the nouns appearing in the memory system are explained in detail in the aforementioned memory device, and the same applies here without further elaboration.

An aspect of examples of the present disclosure provides a memory device, comprising: a memory cell array comprising a plurality of memory cells and a word line coupled with the plurality of memory cells, wherein each of the memory cells is configured to be in one of a plurality of data states; and a peripheral circuit coupled with the memory cell array and configured to: apply a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; and apply a first program pulse to the word line after the verification of the first data state is passed, so as to continue programming on the memory cells that are expected to be programmed to the second data state, wherein the first program pulse is a sum of a second program pulse and a preset offset voltage, and the second program pulse is a previous program pulse of the first program pulse.

In the above-mentioned solution, the peripheral circuit is further configured to: determine a verification result of the second verify operation after the verification of the first data state is passed; divide, according to the verification result, the memory cells that are expected to be programmed to the second data state among the plurality of memory cells into a plurality of groups; and apply different bit line voltages to bit lines coupled with different groups of memory cells among the plurality of groups of memory cells when the memory cells that are expected to be programmed to the second data state among the plurality of memory cells are continuously programmed.

In the above-mentioned solution, the peripheral circuit is further configured to: divide, according to the verification result, the memory cells that are expected to be programmed to the second data state among the plurality of memory cells into a first group and a second group, wherein the memory cells comprised in the first group are programmed to the second data state earlier than the memory cells comprised in the second group; and when the memory cells that are expected to be programmed to the second data state among the plurality of memory cells are continuously programmed, apply a first bit line voltage to the bit line coupled with the memory cells comprised in the first group, and apply a second bit line voltage to the bit line coupled with the memory cells comprised in the second group, wherein the first bit line voltage is greater than the second bit line voltage.

In the above-mentioned solution, the peripheral circuit is further configured to: after the application of the first programming pulse and when the verification of the second data state is not passed, continuously apply a gradually increasing program pulse to the word line coupled with the plurality of memory cells step by step based on the first program pulse and by taking a step incremental voltage as a step size, until the verification of the last data state among the plurality of data states is passed, wherein the step incremental voltage is less than the preset offset voltage.

In the above-mentioned solution, the last data state among the plurality of data states comprises the second data state.

In the above-mentioned solution, the peripheral circuit is further configured to: program each of the plurality of memory cells from one of the plurality of data states to a corresponding target data state among the plurality of target data states.

In the above-mentioned solution, the plurality of data states comprise a data state P0, a data state P1, a data state P2, and a data state P3 with sequentially increasing voltage values comprised in the expected threshold voltage distributions, wherein the first data state comprises the data state P2, and the second data state comprises the data state P3.

In the above-mentioned solution, the plurality of data states comprise 16 target data states, wherein each of the plurality of data states is configured to correspond to 4 target data states.

In the above-mentioned solution, the peripheral circuit is further configured to: record the number of times for applying the program pulse to the word line coupled with the plurality of memory cells; and when the number of times for applying the program pulse is equal to a preset number of times, start to apply the verify voltage to the word line, so as to perform the verify operations on the first data state and the second data state among the plurality of data states simultaneously.

In the above-mentioned solution, the preset offset voltage is positively correlated with the distance between the first expected threshold voltage distribution and the second expected threshold voltage distribution, wherein the greater the distance, the greater the preset bias offset voltage.

Another aspect of examples of the present disclosure provides a program method of a memory device. The memory cell array comprises a plurality of memory cells and a word line coupled with the plurality of memory cells, wherein each of the memory cells is configured to be in one of a plurality of data states. The program method comprises: applying a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; and applying a first program pulse to the word line after the verification of the first data state is passed, so as to continue programming on the memory cells that are expected to be programmed to the second data state among the plurality of memory cells, wherein the first program pulse is a sum of a second program pulse and a preset offset voltage, and the second program pulse is a previous program pulse of the first program pulse.

In the above-mentioned solution, the program method further comprises: determining a verification result of the second verify operation after the verification of the first data state is passed; dividing, according to the verification result, the memory cells that are expected to be programmed to the second data state among the plurality of memory cells into a plurality of groups; and applying different bit line voltages to bit lines coupled with different groups of memory cells among the plurality of groups of memory cells when the memory cells that are expected to be programmed to the second data state among the plurality of memory cells are continuously programmed.

In the above-mentioned solution, dividing, according to the verification result, the memory cells that are expected to be programmed to the second data state among the plurality of memory cells into a plurality of groups comprises: dividing, according to the verification result, the memory cells that are expected to be programmed to the second data state among the plurality of memory cells into a first group and a second group, wherein the memory cells comprised in the first group are programmed to the second data state earlier than the memory cells comprised in the second group; and applying different bit line voltages to bit lines coupled with different groups of memory cells among the plurality of groups of memory cells when the memory cells that are expected to be programmed to the second data state among the plurality of memory cells are continuously programmed comprises: when the memory cells that are expected to be programmed to the second data state among the plurality of memory cells are continuously programmed, applying a first bit line voltage to the bit line coupled with the memory cells comprised in the first group, and applying a second bit line voltage to the bit line coupled with the memory cells comprised in the second group, wherein the first bit line voltage is greater than the second bit line voltage.

In the above-mentioned solution, the program method further comprises: after the application of the first programming pulse and when the verification of the second data state is not passed, continuously applying a gradually increasing program pulse to the word line coupled with the plurality of memory cells step by step based on the first program pulse and by taking a step incremental voltage as a step size, until the verification of the last data state among the plurality of data states is passed, wherein the step incremental voltage is less than the preset offset voltage.

In the above-mentioned solution, the last data state comprises the second data state.

In the above-mentioned solution, the program method further comprises: programming each of the plurality of memory cells from one of the plurality of data states to a corresponding target data state among the plurality of target data states.

In the above-mentioned solution, the plurality of data states comprise a data state P0, a data state P1, a data state P2, and a data state P3 with sequentially increasing voltage values comprised in the expected threshold voltage distributions, wherein the first data state comprises the data state P2, and the second data state comprises the data state P3.

In the above-mentioned solution, the plurality of data states comprise 16 target data states, wherein each of the plurality of data states is configured to correspond to 4 target data states.

In the above-mentioned solution, the program method further comprises: recording the number of times for applying the program pulse to the word line coupled with the plurality of memory cells; and when the number of times for applying the program pulse is equal to a preset number of times, starting to apply the verify voltage to the word line, so as to perform the verify operations on the first data state and the second data state among the plurality of data states simultaneously.

Yet another aspect of examples of the present disclosure provides a memory system, comprising: one or more memory devices described in any one of the above; and a memory controller coupled with the memory device and configured to control the memory device.

The examples of the present disclosure provide a memory device, a program method, and a memory system. The memory device comprises: a memory cell array comprising a plurality of memory cells and a word line coupled with the plurality of memory cells, wherein each of the memory cells is configured to be in one of a plurality of data states; and a peripheral circuit coupled with the memory cell array and configured to: apply a verify voltage to the word line when incremental step pulse programming is performed on the plurality of memory cells, so as to perform a first verify operation on a first data state among the plurality of data states and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold; and apply a first program pulse to the word line after the verification of the first data state is passed, so as to continue programming on the memory cells that are expected to be programmed to the second data state, wherein the first program pulse is a sum of a second program pulse and a preset offset voltage, and the second program pulse is a previous program pulse of the first program pulse. In the memory device provided by the examples of the present disclosure, when the distance between the threshold voltage distributions corresponding to two adjacent data states is greater than the preset threshold, a larger program pulse may be employed to the programming of the next data state, such that the number of times of the program pulses can be saved, thereby achieving the effect of improving the program time.

The above description is intended to be illustrative and not restrictive. For example, the above-mentioned instances (or one or more aspects thereof) may be combined with each other for use. Other examples may be used, for example, those that can be used when those of ordinary skill in the art read the above description. It should be understood that it will not be used to explain or limit the scope or meaning of the claims. In addition, in the above detailed description, various features may be combined together to simplify the present disclosure. This should not be construed to mean that the disclosed features that are not claimed are necessary for any claim. Instead, the subject matter of the disclosure may lie in less than all features of a particular disclosed example. Thus, the appended claims are hereby incorporated into the detailed description, with each claim standing on its own as a separate example, and it is expected that these examples can be combined with each other in various combinations or replacements. The scope of the present disclosure should be determined with reference to the appended claims, along with the full scope of equivalents to which these claims are entitled.

What is claimed is:

1. A memory device, comprising:

a memory cell array including a plurality of memory cells and a word line coupled with the plurality of memory cells, wherein each memory cell of the plurality of memory cells is configured to be in one of a plurality of data states; and a peripheral circuit coupled with the memory cell array and configured to:

apply a verify voltage to the word line when incremental step pulse programming is performed on the plurality of memory cells, further including to:

perform a first verify operation on a first data state among the plurality of data states; and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold;

divide, according to a verification result, memory cells that are expected to be programmed to the second data state among the plurality of memory cells into a first group and a second group, wherein the memory cells included in the first group are programmed to the second data state earlier than the memory cells included in the second group; and apply a first program pulse to the word line after the verification of the first data state is passed to continue programming on the memory cells that are expected to be programmed to the second data state, wherein the first program pulse is a sum of a second program pulse and a preset bias offset voltage, and the second program pulse is a previous program pulse of the first program pulse.

2. The memory device of claim 1, wherein the peripheral circuit is further configured to:

determine the verification result of the second verify operation after the verification of the first data state is passed;

divide, according to the verification result, the memory cells that are expected to be programmed to the second data state among the plurality of memory cells into a plurality of groups; and apply different bit line voltages to bit lines coupled with different groups of memory cells among the plurality of groups of the memory cells when the memory cells that are expected to be programmed to the second data state among the plurality of memory cells are continuously programmed.

3. The memory device of claim 2, wherein the peripheral circuit is further configured to, when the memory cells that are expected to be programmed to the second data state among the plurality of memory cells are continuously programmed, apply a first bit line voltage to a bit line coupled with the memory cells included in the first group, and apply a second bit line voltage to a bit line coupled with the memory cells included in the second group, wherein the first bit line voltage is greater than the second bit line voltage.

4. The memory device of claim 1, wherein the peripheral circuit is further configured to, after the application of the first program pulse and when the verification of the second data state is not passed, continuously apply a gradually increasing program pulse to the word line coupled with the plurality of memory cells step by step based on the first program pulse and by taking a step incremental voltage as a step size, wherein the application of the gradually increasing program pulse continues until the verification of a last data state among the plurality of data states is passed, wherein the step incremental voltage is less than the preset bias offset voltage.

5. The memory device of claim 4, wherein the last data state among the plurality of data states includes the second data state.

6. The memory device of claim 1, wherein the peripheral circuit is further configured to program each of the plurality of memory cells from one of the plurality of data states to a corresponding target data state among a plurality of target data states.

7. The memory device of claim 6, wherein the plurality of data states include a data state P0, a data state P1, a data state P2, and a data state P3 with sequentially increasing voltage values included in the first and second expected threshold voltage distributions, wherein the first data state includes the data state P2, and the second data state includes the data state P3.

8. The memory device of claim 7, wherein the plurality of data states include 16 target data states, wherein each of the plurality of data states is configured to correspond to 4 target data states.

9. The memory device of claim 1, wherein the peripheral circuit is further configured to:

record a number of times for applying the first program pulse and the second program pulse to the word line coupled with the plurality of memory cells for the first program pulse and the second program pulse; and when the number of times for applying the first program pulse and the second program pulse is equal to a preset number of times, apply the verify voltage to the word line, wherein the verify voltage is applied to perform the first verify operation and the second verify operation on the first data state and the second data state among the plurality of data states simultaneously.

10. The memory device of claim 1, wherein the preset bias offset voltage is positively correlated with the distance between the first expected threshold voltage distribution and the second expected threshold voltage distribution, wherein the greater the distance, the greater the preset bias offset voltage.

11. A program method of a memory device, wherein the memory device includes a plurality of memory cells and a word line coupled with the plurality of memory cells, wherein each memory cell is configured to be in one of a plurality of data states, and the program method comprises:

applying a verify voltage to the word line when incremental step pulse programming is performed on the plurality of memory cells, further including:

performing a first verify operation on a first data state among the plurality of data states; and performing a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold;

dividing, according to a verification result, memory cells that are expected to be programmed to the second data state among the plurality of memory cells into a first group and a second group, wherein the memory cells included in the first group are programmed to the second data state earlier than the memory cells included in the second group; and applying a first program pulse to the word line after the verification of the first data state is passed to continue programming on the memory cells that are expected to be programmed to the second data state among the plurality of memory cells, wherein the first program pulse is a sum of a second program pulse and a preset bias offset voltage, and the second program pulse is a previous program pulse of the first program pulse.

12. The program method of claim 11, further including:

determining the verification result of the second verify operation after the verification of the first data state is passed;

dividing, according to the verification result, the memory cells that are expected to be programmed to the second data state among the plurality of memory cells into a plurality of groups; and applying different bit line voltages to bit lines coupled with different groups of memory cells among the plurality of groups of the memory cells when the memory cells that are expected to be programmed to the second data state among the plurality of memory cells are continuously programmed.

13. The program method of claim 12, wherein:

applying the different bit line voltages to bit lines coupled with the different groups of the memory cells among the plurality of groups of the memory cells when the memory cells that are expected to be programmed to the second data state among the plurality of memory cells are continuously programmed further includes, when the memory cells that are expected to be programmed to the second data state among the plurality of memory cells are continuously programmed, applying a first bit line voltage to a bit line coupled with the memory cells included in the first group, and applying a second bit line voltage to a bit line coupled with the memory cells included in the second group, wherein the first bit line voltage is greater than the second bit line voltage.

14. The program method of claim 11, further including, after the application of the first program pulse and when the verification of the second data state is not passed, continuously applying a gradually increasing program pulse to the word line coupled with the plurality of memory cells step by step based on the first program pulse and by taking a step incremental voltage as a step size, wherein the application of the gradually increasing programing pulse continues until the verification of a last data state among the plurality of data states is passed, wherein the step incremental voltage is less than the preset bias offset voltage.

15. The program method of claim 14, wherein the last data state among the plurality of data states includes the second data state.

16. The program method of claim 11, further including programming each of the plurality of memory cells from one of the plurality of data states to a corresponding target data state among a plurality of target data states.

17. The program method of claim 16, wherein the plurality of data states include a data state P0, a data state P1, a data state P2, and a data state P3 with sequentially increasing voltage values included in the first and second expected threshold voltage distributions, wherein the first data state includes the data state P2, and the second data state includes the data state P3.

18. The program method of claim 17, wherein the plurality of data states include 16 target data states, wherein each of the plurality of data states is configured to correspond to 4 target data states.

19. The program method of claim 11, further including:

recording a number of times for applying the first program pulse and the second program pulse to the word line coupled with the plurality of memory cells for the first program pulse and the second program pulse; and when the number of times for applying the first program pulse and the second program pulse is equal to a preset number of times, applying the verify voltage to the word line, wherein the verify voltage is applied to perform the first verify operation and the second verify operation on the first data state and the second data state among the plurality of data states simultaneously.

20. A memory system, comprising:

one or more memory devices, each of the memory devices includes:

a memory cell array including a plurality of memory cells and a word line coupled with the plurality of memory cells, wherein each of the memory cell of the plurality of memory cells is configured to be in one of a plurality of data states; and a peripheral circuit coupled with the memory cell array and configured to:

apply a verify voltage to the word line when incremental step pulse programming is performed on the plurality of memory cells, further including to:

perform a first verify operation on a first data state among the plurality of data states; and perform a second verify operation on a second data state among the plurality of data states, wherein the first data state is adjacent to the second data state, and a distance between a first expected threshold voltage distribution corresponding to the first data state and a second expected threshold voltage distribution corresponding to the second data state is greater than a preset threshold;

divide, according to a verification result, memory cells that are expected to be programmed to the second data state among the plurality of memory cells into a first group and a second group, wherein the memory cells included in the first group are programmed to the second data state earlier than the memory cells included in the second group; and apply a first program pulse to the word line after the verification of the first data state is passed to continue programming on the memory cells that are expected to be programmed to the second data state, wherein the first program pulse is a sum of a second program pulse and a preset bias offset voltage, and the second program pulse is a previous program pulse of the first program pulse; and a memory controller coupled with the one or more memory devices and configured to control the one or more memory devices.

* * * * *